(12) United States Patent
Sunohara et al.

(10) Patent No.: US 8,137,497 B2
(45) Date of Patent: Mar. 20, 2012

(54) METHOD OF MANUFACTURING WIRING SUBSTRATE

(75) Inventors: Masahiro Sunohara, Nagano (JP); Kei Murayama, Nagano (JP); Mitsutoshi Higashi, Nagano (JP); Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 340 days.

(21) Appl. No.: 12/409,873

(22) Filed: Mar. 24, 2009

(65) Prior Publication Data
US 2009/0242107 A1 Oct. 1, 2009

(30) Foreign Application Priority Data
Mar. 25, 2008 (JP) .................................. 2008-078396

(51) Int. Cl.
*B29C 37/00* (2006.01)

(52) U.S. Cl. ......................... 156/247; 156/232; 156/241

(58) Field of Classification Search ................... 156/247
See application file for complete search history.

(56) References Cited

U.S. PATENT DOCUMENTS

| 5,960,536 | A  | * | 10/1999 | Ogino et al. ................... 29/841 |
| 7,087,992 | B2 | * | 8/2006  | Chua et al. .................... 257/723 |
| 7,253,515 | B2 | * | 8/2007  | Horie et al. ................... 257/704 |
| 2003/0227095 | A1 | * | 12/2003 | Fujisawa et al. .............. 257/782 |
| 2009/0236232 | A1 | * | 9/2009  | Kanki ............................ 205/157 |
| 2009/0242107 | A1 | * | 10/2009 | Sunohara et al. ............. 156/232 |

FOREIGN PATENT DOCUMENTS

| JP | 2002-170840   |   | 6/2002 |
| JP | 2002170840 A  | * | 6/2002 |
| JP | 2002-246757   |   | 8/2002 |
| JP | 2002246757 A  | * | 8/2002 |

\* cited by examiner

*Primary Examiner* — Philip Tucker
*Assistant Examiner* — Vicki Wu
(74) *Attorney, Agent, or Firm* — Rankin, Hill & Clark LLP

(57) ABSTRACT

A method includes the steps of providing a first tape base material on a single side of a stiffener substrate, forming, on the stiffener substrate, a cavity for accommodating a semiconductor chip therein, inserting the stiffener substrate in the cavity and providing the stiffener substrate on the first tape base material, sealing the semiconductor chip and the stiffener substrate with a sealing resin, and removing the first tape base material and forming a build-up layer on a tape removing surface.

14 Claims, 19 Drawing Sheets

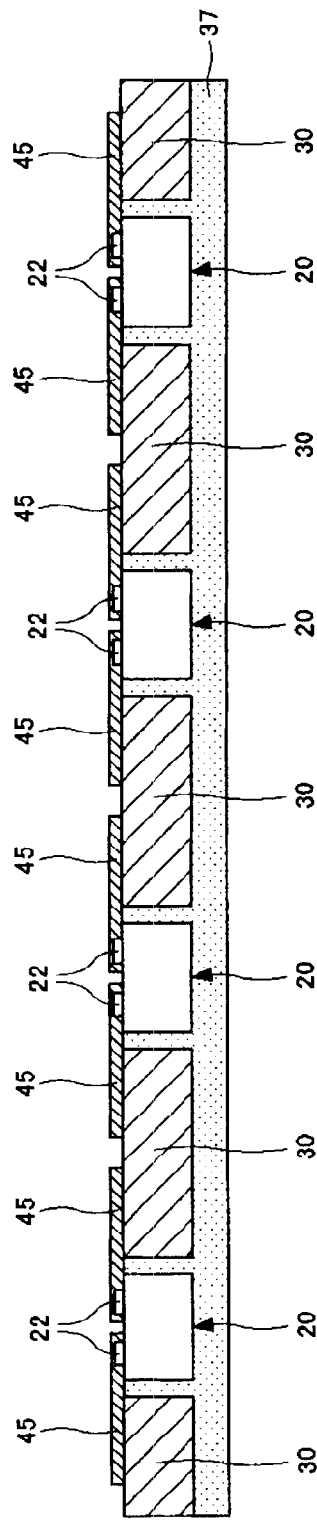
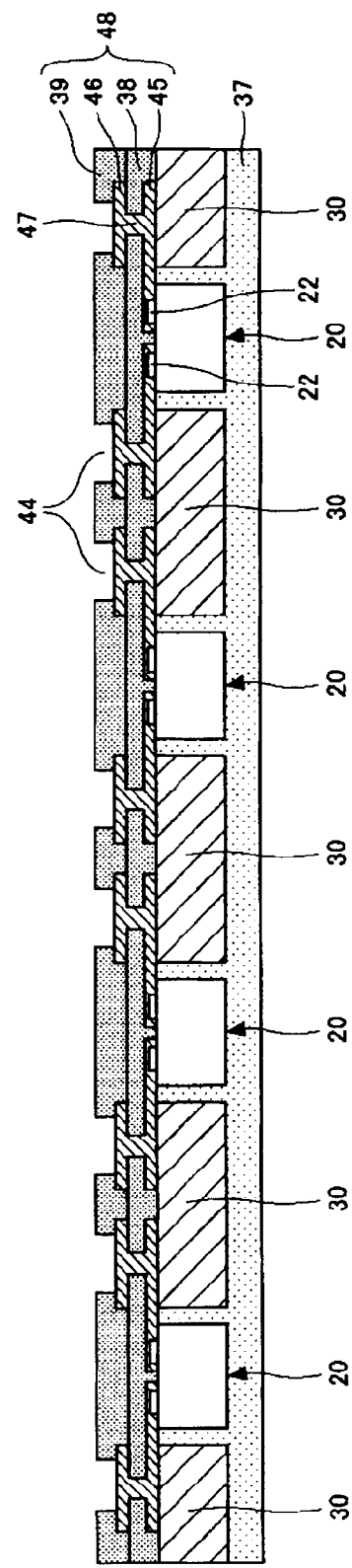
FIG. 7A
FIG. 7B

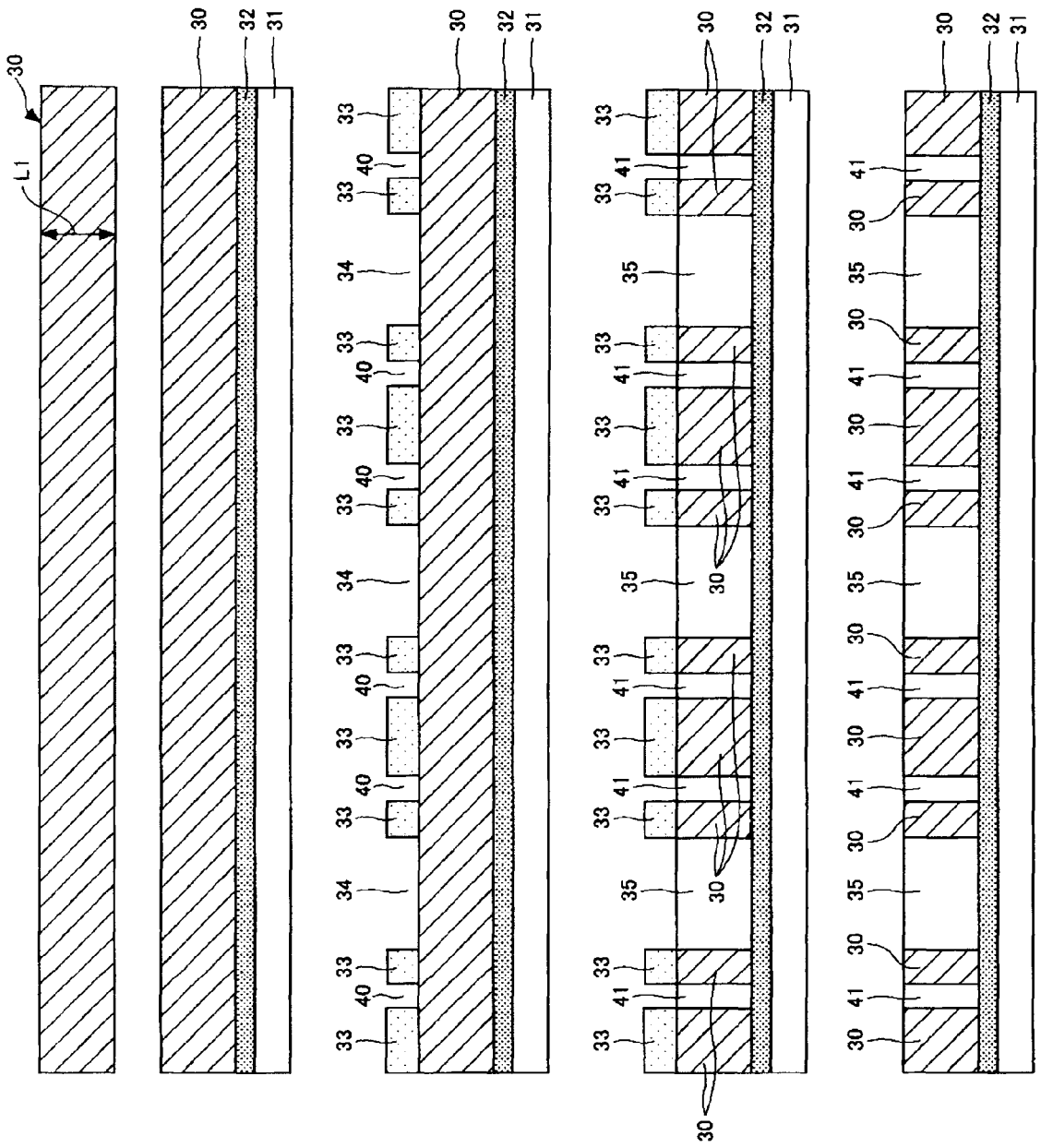

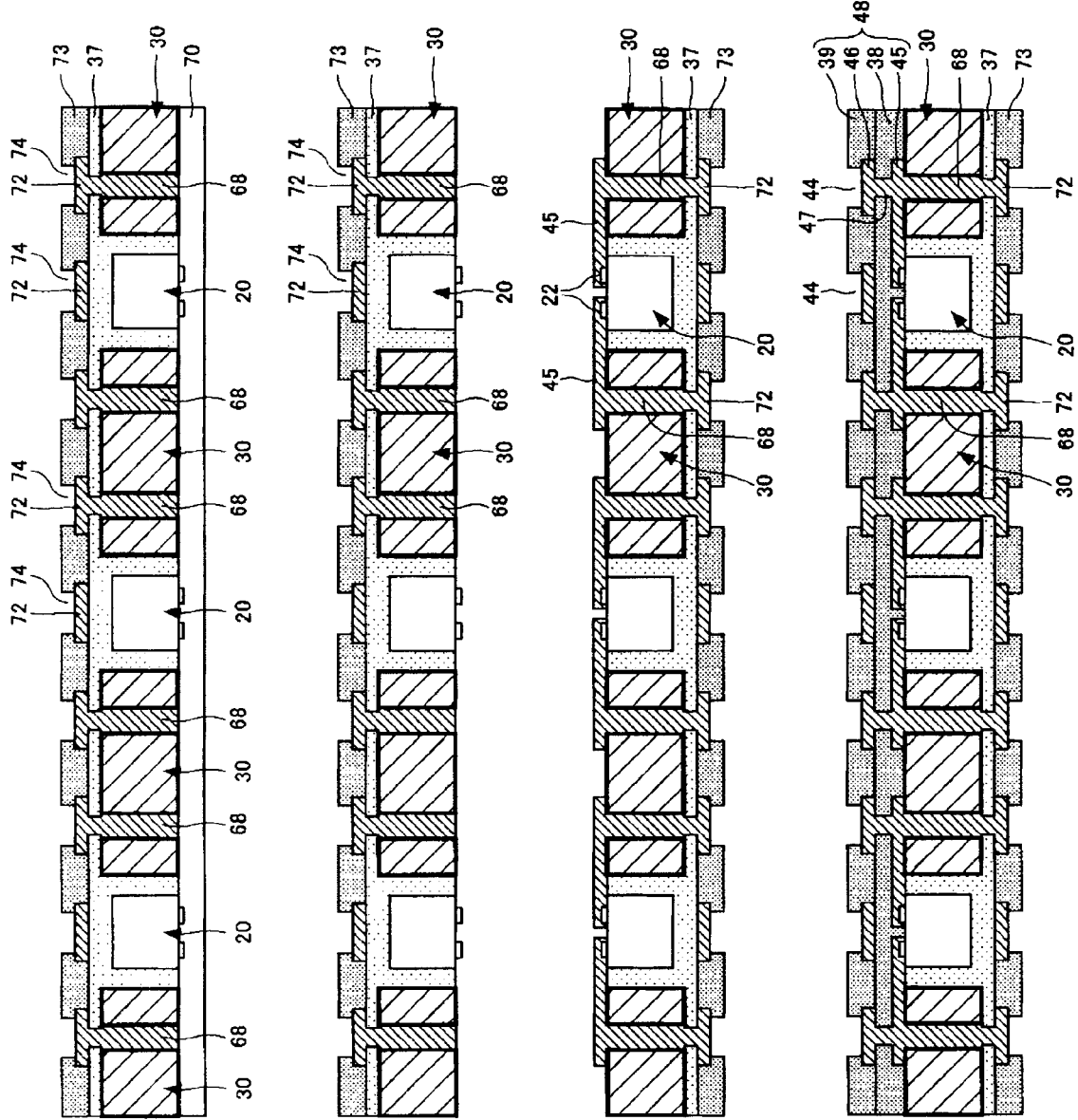

METHOD OF MANUFACTURING WIRING SUBSTRATE

TECHNICAL FIELD

The present disclosure relates to a method of manufacturing a wiring substrate, and more particularly to a method of manufacturing a wiring substrate having a structure including a chip component.

RELATED ART

In recent years, high density mounting of an electronic component to be incorporated in an electronic apparatus has rapidly been advanced with a demand of an enhancement in a performance or a reduction in a size for the electronic apparatus. Conventionally, there has been employed a method of manufacturing a substrate and a semiconductor chip at separate steps and flip-chip mounting the semiconductor chip on the substrate thus manufactured individually.

According to the method, however, it is hard to obtain an increase in a density and a reduction in a size which are sufficient. For this reason, there has also been proposed a so-called chip built-in substrate in which a chip component is provided on a substrate core portion and a build-up wiring layer is then stacked on the substrate core portion in a process for manufacturing the substrate.

According to the chip built-in substrate, it is possible to reduce a size. However, an electrical connection of a pad of a build-up wiring layer and a chip component is carried out by using a bump. For this reason, a thickness of the substrate is increased corresponding to a height of the bump. With a structure in which the chip component and the pad of the build-up wiring layer are connected to each other by using the bump, moreover, there is a problem in that an inductance in the connecting portion is raised, and particularly, an operation at a high clock frequency becomes unstable.

Therefore, the technique disclosed in Patent Document 1 or a package technique referred to as BBUL (Bumpless Build-up Layer) has been proposed as a method of directly connecting a pad provided on a chip component to an electrode provided on a substrate.

FIG. 1A to FIG. 2D show an example of a method of manufacturing a wiring substrate by using the BBUL.

In order to manufacture the wiring substrate by using the BBUL, as shown in FIG. 1A, a tape base material 3 having an adhesive 4 provided on a surface is prepared. A semiconductor chip 1 (a chip component) is provided on the tape base material 3.

A pad 2 is previously formed on the semiconductor chip 1 and a direction is adjusted in such a manner that the pad 2 is provided facedown, and the semiconductor chip 1 is stuck to the adhesive 4. In this case, a pitch between the adjacent semiconductor chips 1 to each other is set to be a pitch P1 (shown in an arrow of the drawing) of a semiconductor device 9 (see FIG. 2D) which is finally divided into individual pieces.

Subsequently, the tape base material 3 on which the semiconductor chip 1 is provided is put in a metal mold to form a mold resin 5 in a heating and pressurizing environment. Consequently, the semiconductor chip 1 is sealed with the mold resin 5.

When the mold resin 5 is formed, the tape base material 3 is peeled from the semiconductor chip 1 and the mold resin 5 as shown in FIG. 1C. In this state, the pad 2 is exposed from the mold resin 5. As shown in FIG. 2A, subsequently, a first wiring layer 6 is formed on the mold resin 5 by using a well-known semiadditive process. In this case, the first wiring layer 6 is directly connected electrically to the pad 2.

When the first wiring layer 6 is formed, an insulating layer and a wiring layer are alternately stacked on the mold resin 5 by using a build-up process and an via used to join the respective layers is formed, and a build-up wiring layer 7 including the first wiring layer 6 is formed as shown in FIG. 2B. Consequently, the wiring substrate 9 including the semiconductor chip 1 is manufactured.

As shown in FIG. 2C, next, a ball 8 is disposed in an opening formed on the insulating layer provided on an uppermost layer of the build-up wiring layer 7. Then, the wiring substrate 9 is subjected to a dicing processing and is thus divided into individual pieces so that a semiconductor device 9A including the semiconductor chip 1 is manufactured as shown in FIG. 2D.

[Patent Document 1] JP-A-2002-170840 Publication

In the method of manufacturing a wiring substrate using the BBUL shown in FIG. 1A to FIG. 2D, however, the semiconductor chip 1 is embedded in the mold resin 5. For this reason, there is a possibility that a position in which the semiconductor chip 1 is disposed might be shifted due to a thermal contraction in the formation of the mold resin 5. Consequently, the pitch P1 of the semiconductor chip 1 which is normal in the disposition on the tape base material 3 shown in FIG. 1A might be shifted to be P2 (P1≠P2) after the formation of the mold resin 5. In this case, there is a possibility that a connecting failure of the pad 2 of the semiconductor chip 1 and the first wiring layer 6 might be caused.

In the method of manufacturing a wiring substrate using the BBUL shown in FIG. 1A to FIG. 2D, moreover, the build-up wiring layer 7 including the first wiring layer 6 is formed on an upper surface of the mold resin 5. In this case, the upper surface of the mold resin 5 has a high roughness. For this reason, the build-up wiring layer 7 cannot be formed with high precision so that it is hard to form a fine wiring.

SUMMARY

Exemplary embodiments of the present invention provide a method of manufacturing a wiring substrate which can form a fine wiring, and furthermore, can suppress an occurrence of a connecting failure and can enhance a reliability.

A first aspect of the invention is directed to a method of manufacturing a wiring substrate including a first step of providing a tape member on one surface of a reinforcing substrate; a second step of forming, on the reinforcing substrate, a through opening for accommodating a chip component therein; a third step of inserting the chip component in the through opening and providing the chip component on the tape member; a fourth step of sealing the reinforcing substrate and the chip component with a resin; and a fifth step of removing the tape member and forming a build-up layer having an insulating layer and a wiring layer stacked on a surface from which the tape member is removed.

In the invention, moreover, it is desirable that the reinforcing substrate should be formed by a material having a coefficient of thermal expansion which is equal to that of the chip component. In this case, it is more preferable that materials of the reinforcing substrate and the chip component should be set to be silicon.

In the invention, furthermore, it is desirable that the resin should be formed by using a molding process at the fourth step. In addition, it is desirable that a coefficient of elasticity of the resin should be equal to or higher than 100 MPa and should be equal to or lower than 3000 MPa.

In the invention, moreover, it is also possible to execute a step (a sixth step) of dicing the reinforcing substrate after the fifth step is ended.

In the invention, furthermore, it is also possible to form the through opening and a through hole on the reinforcing substrate at the second step, and to execute a through electrode forming step of forming a through electrode in the through hole after ending the second step and before executing the third step.

In this case, it is desirable that the through electrode forming step should include the steps of providing a copper plate on the reinforcing substrate having the through opening and the through hole formed thereon; feeding a power by using the copper plate to form a copper layer in the through opening and the through hole by electrolytic plating; removing the copper plate; and removing the copper layer formed in the through opening.

In addition, it is also possible to execute a through electrode forming step of forming a through hole on the reinforcing substrate and forming a through electrode in the through hole before an execution of the first step.

According to the invention, the chip component is provided in the through opening formed on the reinforcing substrate. Therefore, the resin for fixing the chip component to the reinforcing substrate is disposed in only a clearance portion provided between the chip component formed in the through opening and the reinforcing substrate. Even if a contraction is generated when the resin is cured, accordingly, the chip component is rarely influenced. Thus, it is possible to connect the chip component and the wiring (the build-up layer) reliably and electrically. Moreover, the build-up layer is mainly formed on upper surfaces of the reinforcing substrate and the chip component, and a surface roughness of each of the upper surfaces is lower than that of the conventional resin. Therefore, it is possible to form a fine wiring.

Other features and advantages may be apparent from the following detailed description, the accompanying drawings and the claims.

BRIEF DESCRIPTION OF THE DRAWINGS

FIGS. 7A and 7B are views (No. 5) for explaining the method of manufacturing a wiring substrate according to the first embodiment of the invention, FIGS. 10A to 10E are views (No. 1) for explaining a method of manufacturing a wiring substrate according to a second embodiment of the invention, FIGS. 16A to 16D are views (No. 7) for explaining the method of manufacturing a wiring substrate according to the second embodiment of the invention.

DETAILED DESCRIPTION

Next, the best mode for carrying out the invention will be described with reference to the drawings.

FIGS. 3A to 9B are views showing a method of manufacturing a wiring substrate according to a first embodiment of the invention in accordance with a manufacturing procedure. Description will be given to an example in which a semiconductor chip 20 (formed of silicon) is used as a chip component to be provided (to be included in the wiring substrate).

Figures 1A, 1B, 1C:
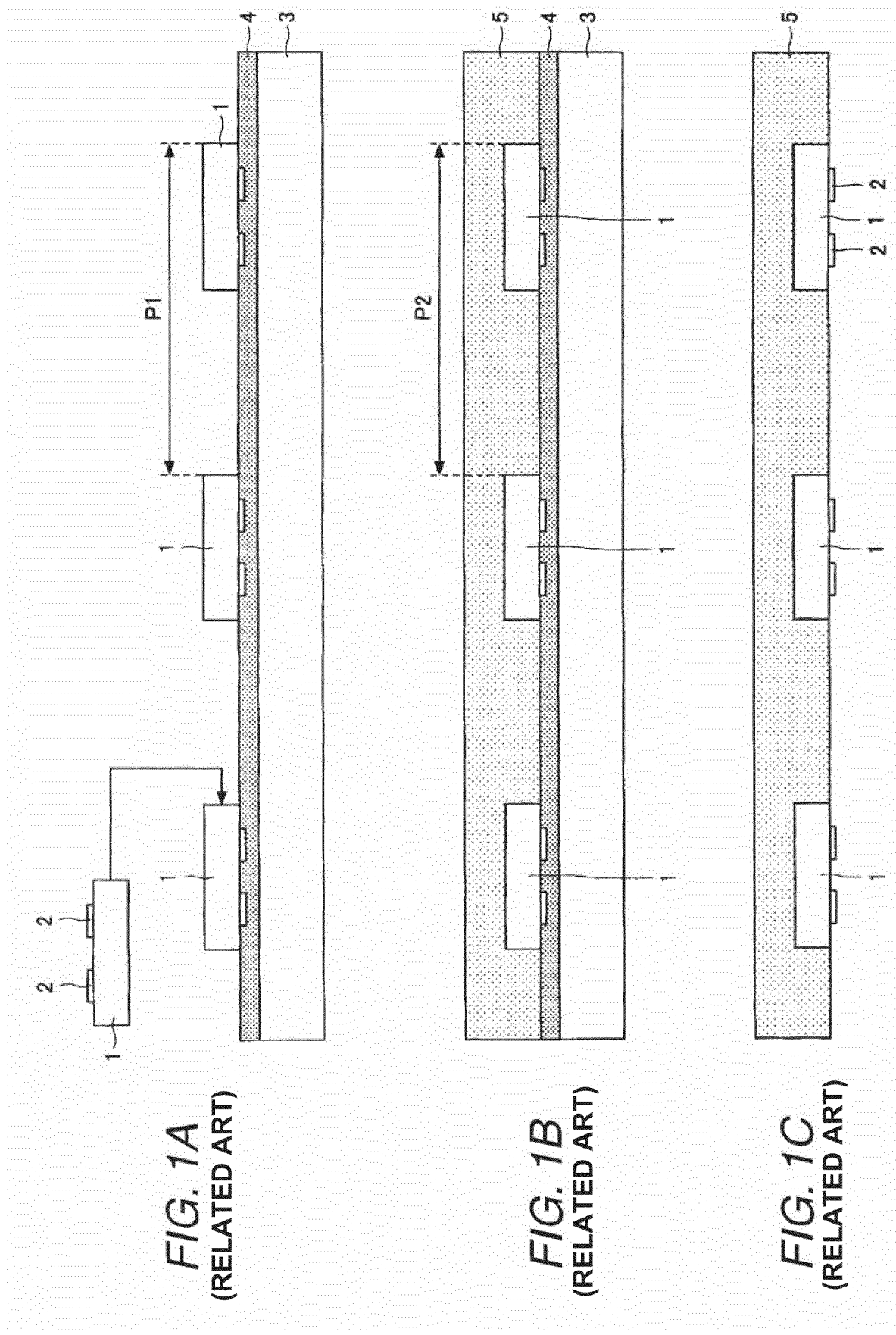
FIGS. 1A to 1C are views (No. 1) for explaining an example of a method of manufacturing a wiring substrate according to the related-art.
Figures 2A, 2B, 2C, 2D:
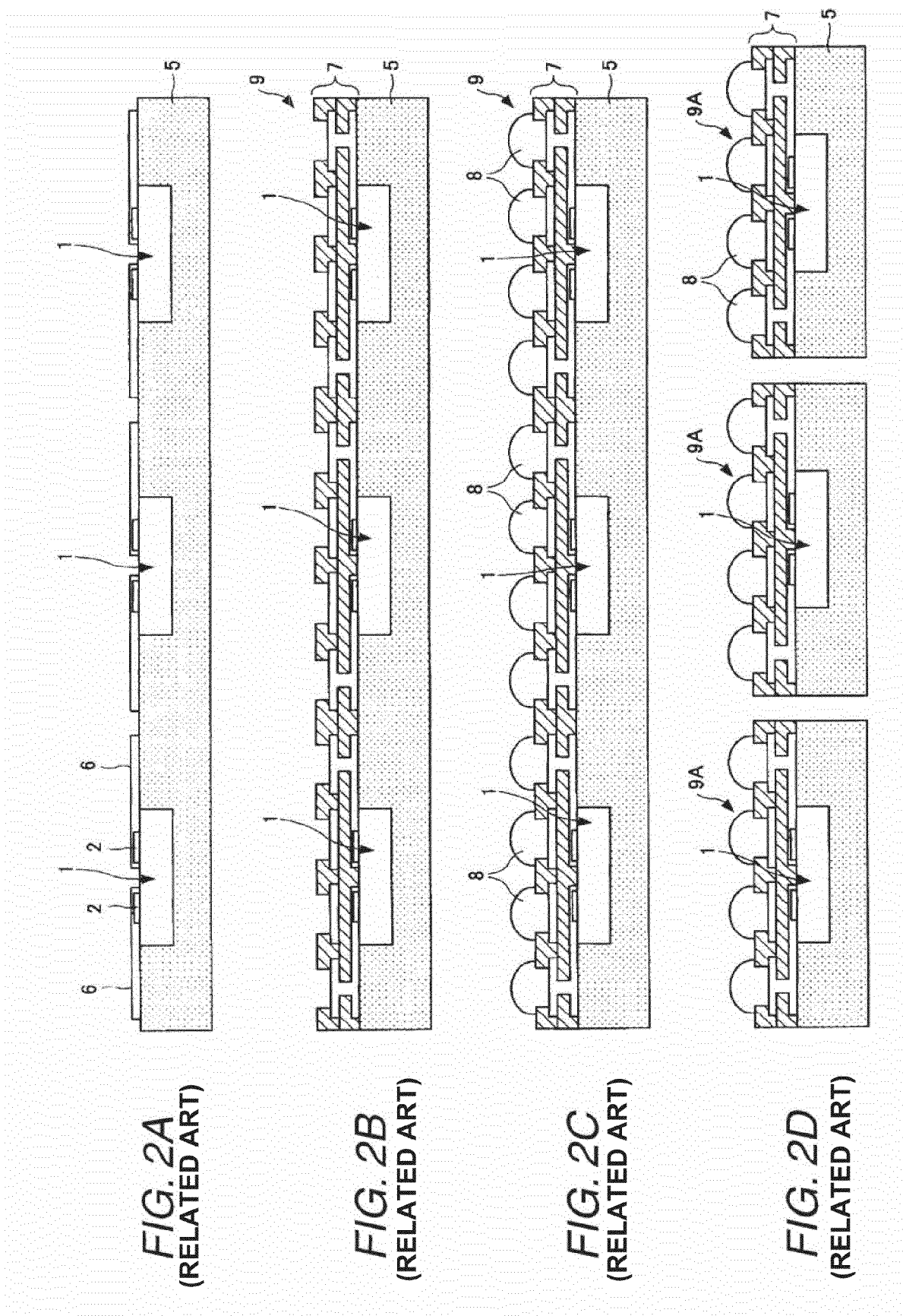
FIGS. 2A to 2D are views (No. 2) for explaining an example of the method of manufacturing a wiring substrate according to the related-art.
Figure 3A:
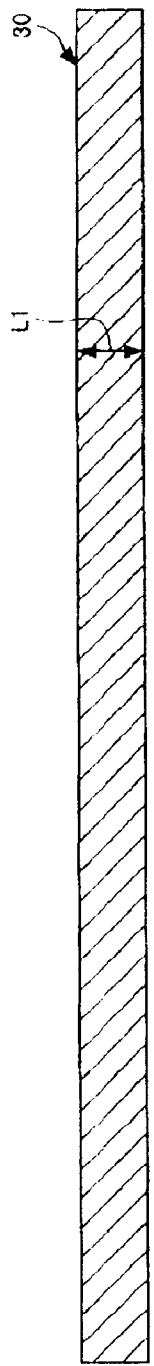
FIGS. 3A to 3D are views (No. 1) for explaining a method of manufacturing a wiring substrate according to a first embodiment of the invention.

In order to manufacture the wiring substrate, first of all, a stiffener substrate 30 (corresponding to a reinforcing substrate) shown in FIG. 3A is prepared. For the stiffener substrate 30, a silicon wafer is used in the embodiment.

A material of the stiffener substrate 30 is not restricted to silicon but it is also possible to use another material (a resin, a metal or their composite material) which can support (reinforce) a build-up wiring layer 48 constituting a wiring substrate 60 to be manufactured and has a small difference in a thermal expansion from the semiconductor chip 20 to be mounted. Moreover, the stiffener substrate 30 is not always the wafer but a material taking a shape (for example, a shape of a strap) other than the wafer may be used as the stiffener substrate 30.

A polishing processing is subsequently executed over the stiffener substrate 30 to have a predetermined thickness L1. The thickness L1 of the stiffener substrate 30 is set to support (reinforce) the build-up wiring layer 48 and to provide the semiconductor chip 20 therein. In the embodiment, the thickness L1 of the stiffener substrate 30 is set to be 200 to 725 μm.

Figure 3B:
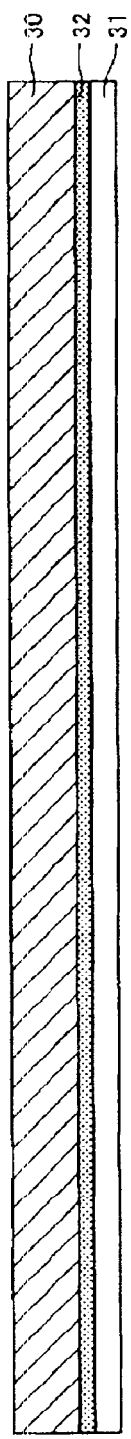

Then, a first tape base material 31 is provided through an adhesive 32 on one surface (a lower surface in the drawing) of the stiffener substrate 30 subjected to the polishing processing as shown in FIG. 3B (which corresponds to a first step). For the adhesive 32, a UV curing resin to be cured by an irradiation of ultraviolet rays (UV) is used in the embodiment. However, it is also possible to use a resin (a thermosetting resin or an X-ray curing resin) which is cured by a heat or an irradiation of X rays, for example.

Moreover, it is possible to use polyethylene terephthalate (PET) as a material of the first tape base material 31, for example. A thickness of the first tape base material 31 is approximately 100 μm and a thickness of the adhesive 32 is approximately 20 μm.

Figure 3C:
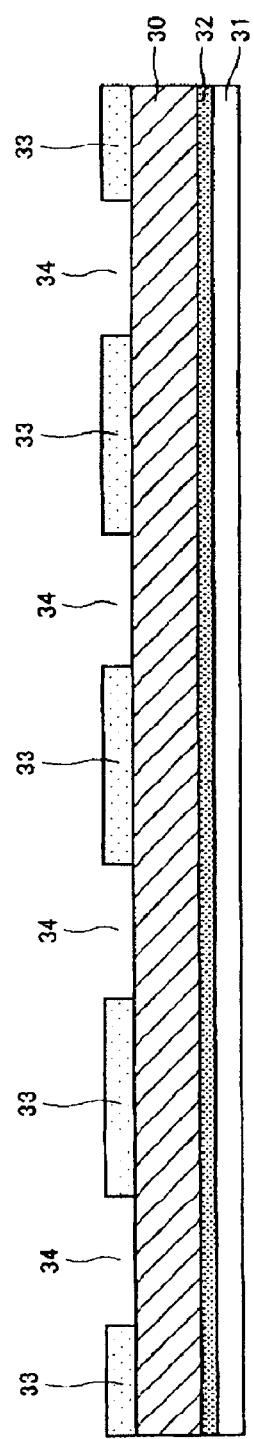

Next, a resist 33 is formed on the stiffener substrate 30 and an opening pattern 34 is formed on the resist 33 as shown in FIG. 3C. A position in which the opening pattern 34 is to be formed corresponds to a position in which a semiconductor chip 1 is to be provided, and a size thereof is set to be slightly larger than a shape of a semiconductor chip 20 (which will be described below).

Moreover, a photoresist can be used as the resist 33 and both positive and negative types can also be used. Furthermore, it is possible to use an ultraviolet light for a light source to be used in patterning of a resist 33.

Subsequently, the resist 33 is cured by heating, and is then used as a mask to execute a dry etching processing over the stiffener substrate 30. As an etching gas to be used for the dry etching process, for example, it is possible to use carbon tetrafluoride ($CF_4$). As the etching process, moreover, it is possible to use plasma etching or reactive ion etching (RIE).

Figure 3D:
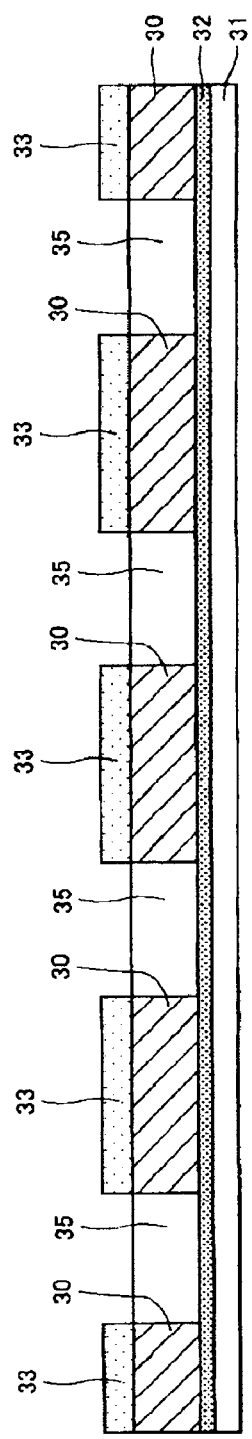

By executing the dry etching processing, a capacity 35 is formed on the stiffener substrate 30 (which corresponds to a second step). FIG. 3D shows a state in which the cavity 35 is formed on the stiffener substrate 30. The cavity 35 is formed to penetrate the stiffener substrate 30. Consequently, the first tape base material 31 is exposed from a bottom part of the cavity 35.

The cavity 35 formed on the stiffener substrate 30 fulfills a function for accommodating the semiconductor chip 1 therein. For this reason, the cavity 35 is set to have such a size as to reliably accommodate the semiconductor chip 1 in the cavity 35.

However, the stiffener substrate 30 functions as a reinforcing material, and a mechanical strength is reduced when a shape of the opening pattern 34 is increased. Furthermore, a sealing resin 37 is provided in the cavity 35 as will be described below. For this reason, the cavity 35 is set to have such a size that a clearance of approximately 5 to 10 μm (ΔW shown in an arrow of FIG. 5A) is formed between an outer wall of the semiconductor chip 20 and an inner wall of the cavity 35 in a state in which the semiconductor chip 20 is attached.

The first and second steps may have order exchanged. More specifically, the cavity 35 may be formed on the stiffener substrate 30 and the stiffener substrate 30 having the cavity 35 formed thereon may be then stuck to the first tape base material 31.

Figure 4A:
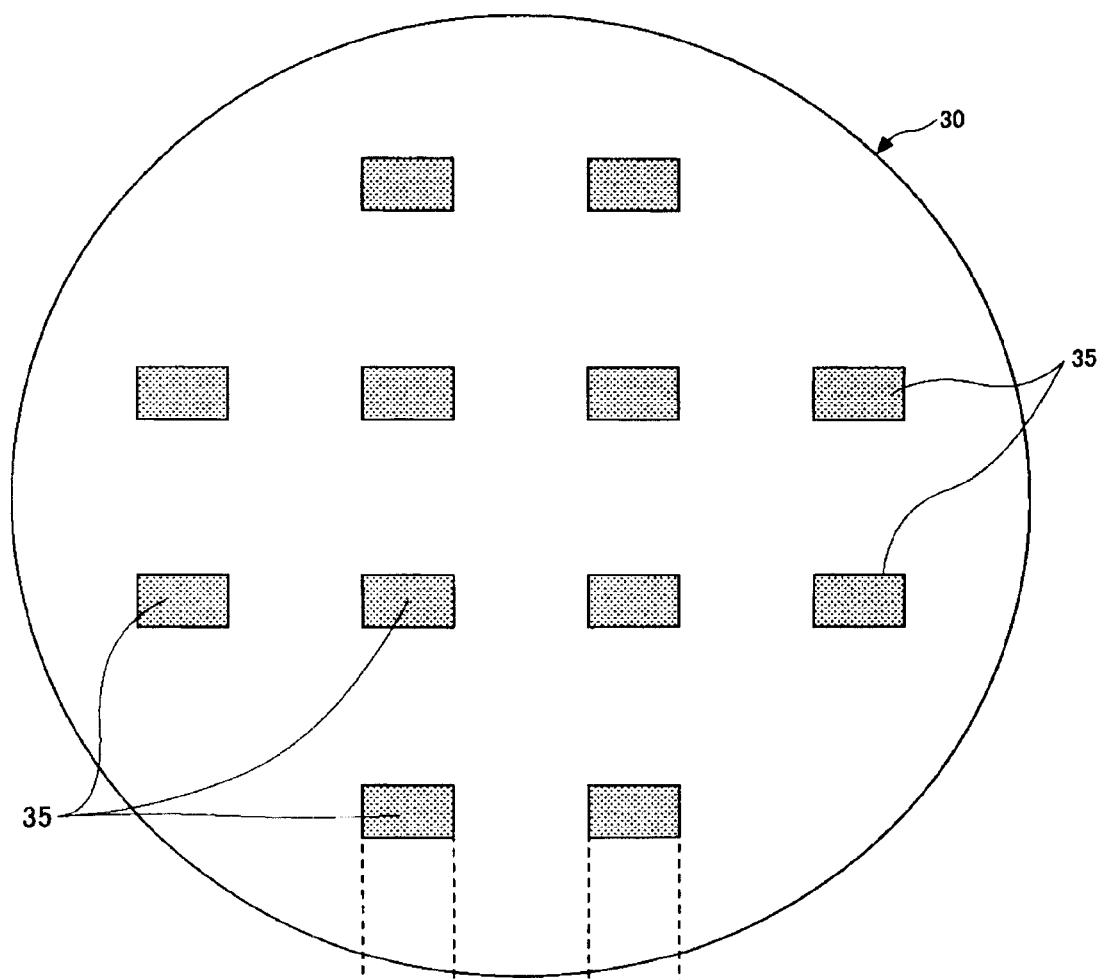
FIGS. 4A and 4B are views (No. 2) for explaining the method of manufacturing a wiring substrate according to the first embodiment of the invention.
Figure 4B:
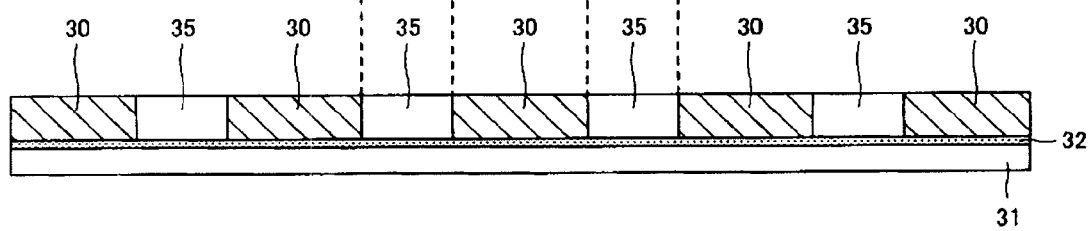

When the cavity 35 is formed on the stiffener substrate 30, thus, the resist 33 is removed by ashing as shown in FIGS. 4A and 4B. FIG. 4A is a plan view showing the stiffener substrate 30 and FIG. 4B is a sectional view in the position of the stiffener substrate 30 in which the cavity 35 is formed. For the ashing processing, it is possible to use a plasma ashing device using an oxygen plasma, for example.

Figures 5A, 5B:
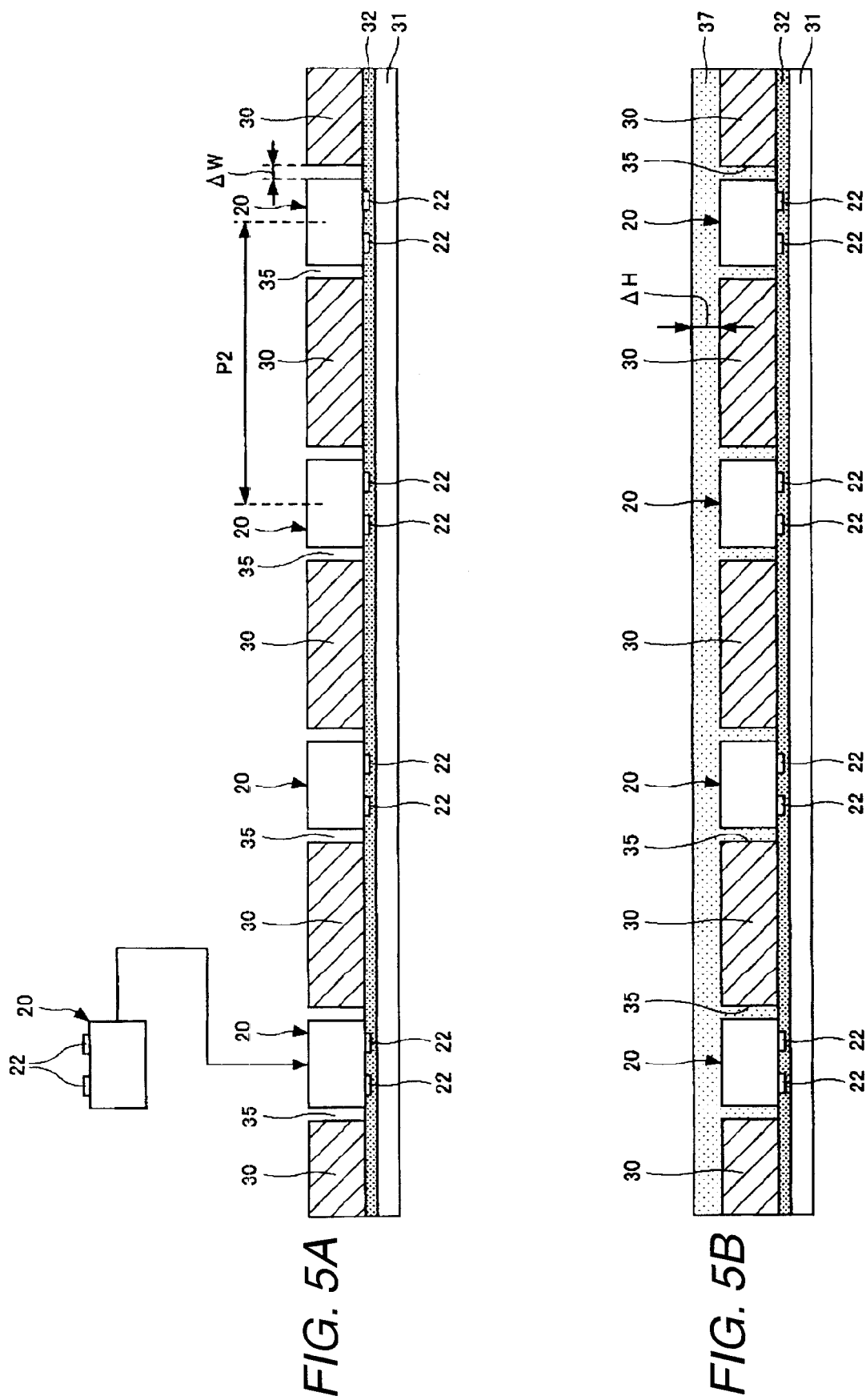
FIGS. 5A and 5B are views (No. 3) for explaining the method of manufacturing a wiring substrate according to the first embodiment of the invention.

Subsequently, the semiconductor chip 20 is inserted into the cavity 35 formed on the stiffener substrate 30 and is stuck to the first tape base material 31 through the adhesive 32 as shown in FIG. 5A (which corresponds to a third step).

In this case, the semiconductor chip 20 is attached into the cavity 35 facedown. Accordingly, the semiconductor chip 20 is stuck to the first tape base material 31 in such a manner that a pad 22 formed on a main surface of the semiconductor chip 20 is opposed to the first tape base material 31.

In this case, the size of the cavity 35 is set to be slightly larger than that of the semiconductor chip 20 as described above. Accordingly, the semiconductor chip 20 can easily be attached into the cavity 35. Moreover, it is possible to prevent a shift from being generated in the position in which the semiconductor chip 20 is to be provided over the position in which the cavity 35 is to be formed.

As described above, the clearance shown in the arrow ΔW of FIG. 5A is formed between the outer wall of the semiconductor chip 20 and the inner wall of the cavity 35 in the state in which the semiconductor chip 20 is provided in the cavity 35. Moreover, a pitch of the cavity 35 provided on the stiffener substrate 30 is formed by a pitch of a wiring substrate 60A to be manufactured. Furthermore, the position of the cavity 35 in which the semiconductor chip 20 is to be provided is also set to correspond to the pitch of the wiring substrate 60A to be manufactured.

When the semiconductor chip 20 is provided in the cavity 35 as described above, the stiffener substrate 30 and the semiconductor chip 20 which are stuck to the first tape base material 31 are attached to a metal mold. In a heating and pressurizing environment, the sealing resin 37 is then molded (which corresponds to a fourth step). The sealing resin 37 is provided in the cavity 35 and is formed to cover upper surfaces of the semiconductor chip 20 and the stiffener substrate 30. In the embodiment, the sealing resin 37 is formed to have a thickness of approximately 5 to 50 μm (shown in an arrow ΔH of FIG. 5B) with respect to the upper surfaces of the semiconductor chip 20 and the stiffener substrate 30.

FIG. 5B shows a state in which the sealing resin 37 is formed. By forming the sealing resin 37, the semiconductor chip 20 and the stiffener substrate 30 are sealed in the sealing resin 37. Moreover, the sealing resin 37 causes the semiconductor chip 20 and the stiffener substrate 30 to be fixed through the sealing resin 37. More specifically, the sealing resin 37 also functions as an adhesive for fixing the semiconductor chip 20 and the stiffener substrate 30.

When the sealing resin 37 is to be formed, a thermal contraction is generated on the sealing resin 37 as described above. In the embodiment, however, the semiconductor chip 20 is provided in the cavity 35 formed on the stiffener substrate 30 and the sealing resin 37 is provided in the slight clearance formed between the outer wall of the semiconductor chip 20 and the inner wall of the cavity 35. In the embodiment, thus, a region in which the sealing resin 37 is provided is small. Therefore, an influence of the thermal contraction of the sealing resin 37 is small and the position in which the semiconductor chip 20 is provided can be prevented from being shifted greatly.

Moreover, the semiconductor chip 20 is provided in the cavity 35 formed on the stiffener substrate 30. Therefore, the semiconductor chip 20 is protected by the stiffener substrate 30. Moreover, the semiconductor chip 20 and the stiffener substrate 30 are formed by the same material, that is, silicon. Even if heating is carried out, accordingly, a difference in a thermal expansion is not made between the semiconductor chip 20 and the stiffener substrate 30 and a stress is not generated between the semiconductor chip 20 and the stiffener substrate 30.

In the embodiment, furthermore, a material to be used for the sealing resin 37 has a coefficient of elasticity of 100 MPa or higher and 3000 MPa or lower. Even if the stress is generated among the semiconductor chip 20, the stiffener substrate 30 and the first tape base material 31, consequently, the sealing resin 37 is elastically deformed so that the stress can be buffered. The coefficient of elasticity of the sealing resin 37 is set to be equal to or higher than 100 MPa and to be equal to or lower than 3000 MPa for the following reason. When the coefficient of elasticity is lower than 100 MPa, the elasticity is excessively low so that the stress cannot be relieved effectively. If the coefficient of elasticity exceeds 3000 MPa, moreover, the elasticity is excessively high so that there is a possibility that the semiconductor chip 20 might be displaced due to the elastic deformation of the sealing resin 37 in the cavity 35, resulting in a positional shift.

In addition, in the embodiment, a transfer molding process is used in place of a resin sheet or a potting process in order to seal the semiconductor chip 20 with the sealing resin 37. According to the process, also in the case in which only the slight clearance is present between the outer wall of the semiconductor chip 20 and the inner wall of the cavity 35, the sealing resin 37 can reliably be filled in the clearance.

Although an epoxy based resin is used as a specific material of the sealing resin 37 in the embodiment, the material of the sealing resin 37 is not restricted thereto but it is also possible to select other materials (for example, a polyimide based resin) which can satisfy the conditions.

When the sealing resin 37 is formed as described above, an ultraviolet light is irradiated to cure the adhesive 32, thereby reducing an adhesive strength. When the adhesive strength is reduced, then, the first tape base material 31 is peeled from the semiconductor chip 20 and the stiffener substrate 30.

Figure 6A:
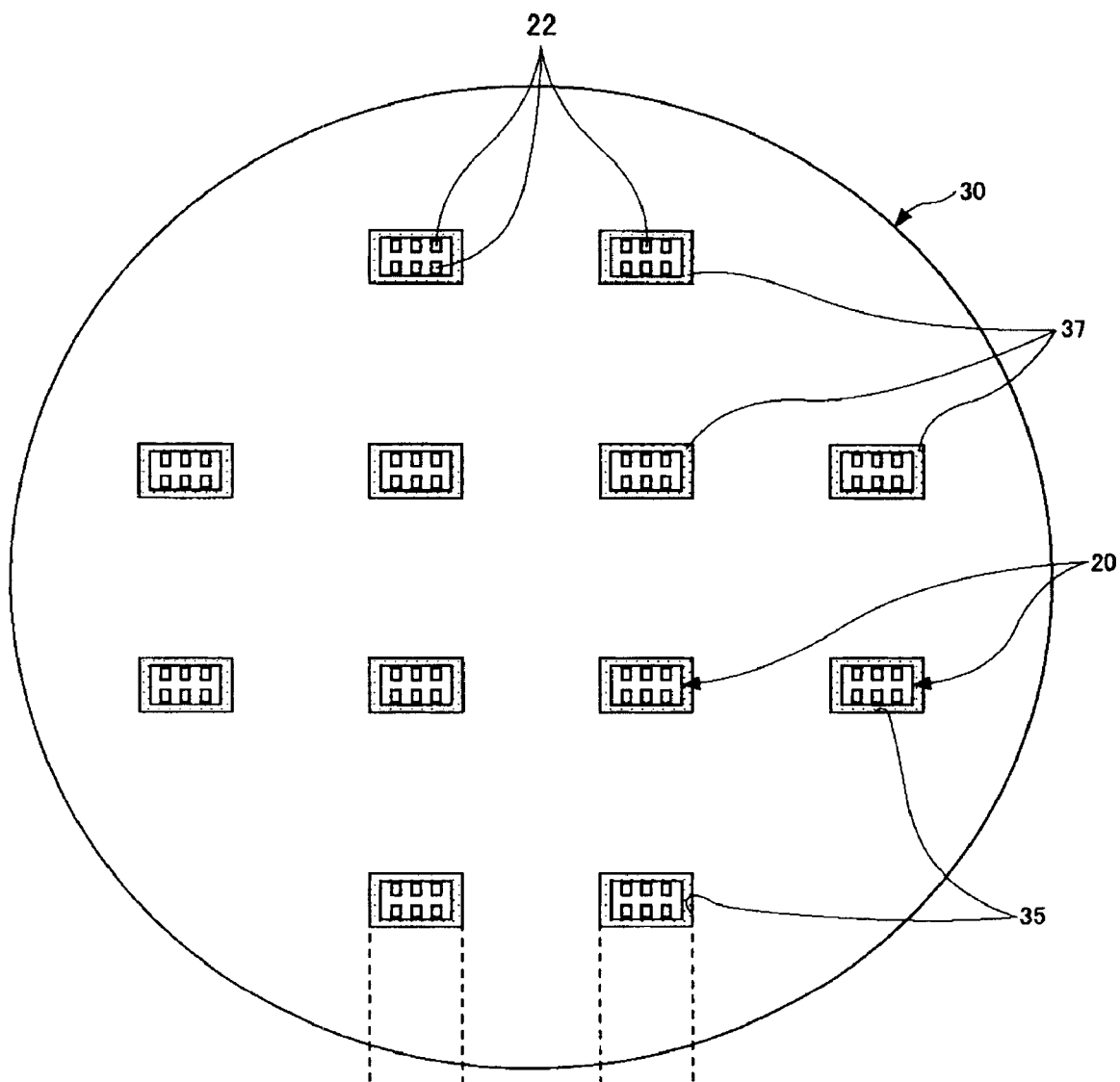
FIGS. 6A and 6B are views (No. 4) for explaining the method of manufacturing a wiring substrate according to the first embodiment of the invention.
Figure 6B:
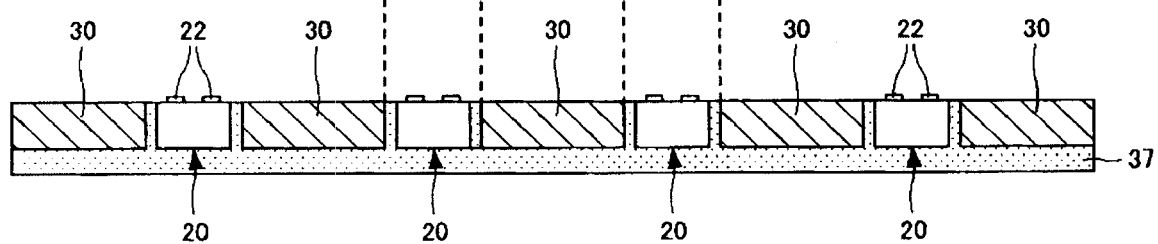

FIGS. 6A and 6B show a state in which the first tape base material 31 is peeled. FIG. 6A is a plan view showing the stiffener substrate 30 and the FIG. 6B is a sectional view in the position of the stiffener substrate 30 in which the semiconductor chip 20 is provided.

As described above, in the embodiment, there is employed the structure in which the sealing resin 37 is formed by using the transfer molding process to reliably fill the sealing resin 37 in the slight clearance provided between the outer wall of the semiconductor chip 20 and the inner wall of the cavity 35. When the first tape base material 31 is peeled, therefore, a surface from which the first tape base material 31 is peeled (which will be hereinafter referred to as a tape peeling surface) can be a smooth surface having no concavo-convex portion.

As shown in FIG. 7A, subsequently, a first wiring layer 45 formed of Cu is provided on the tape peeling surface by using a well-known semiadditive process. More specifically, a catalytic treatment is carried out over the tape peeling surface (the upper surfaces of the semiconductor chip 20, the stiffener substrate 30 and the sealing resin 37 in the drawing) and electroless Cu plating is then carried out to form a seed layer. In this case, the pad 22 formed on the semiconductor chip 20 and the first wiring layer 45 are directly connected to each other without a bump.

Next, a resist having an opening pattern corresponding to a shape of the first wiring layer 45 is formed on the tape peeling surface. Thereafter, electrolytic Cu plating is executed by using the seed layer as a feeding layer so that the first wiring layer 45 is formed in the opening pattern.

When the first wiring layer 45 is thus formed, the resist is peeled and the unnecessary seed layer is removed. Consequently, the first wiring layer 45 shown in FIG. 7A is formed. The catalyst, the seed layer and the resist are not shown.

When the first wiring layer 45 is formed, an insulating layer and a wiring layer are alternately stacked on a first insulating layer 38 by using a build-up process and an via used to join the respective layers is formed so that a build-up wiring layer 48 including the first wiring layer 45 is formed (which corresponds to a fifth step). FIG. 7B shows a state in which the build-up wiring layer 48 is formed.

As a specific method of forming the build-up wiring layer 48, a second insulating layer 39 (a build-up insulating sheet) is provided on the first insulating layer 38 on which the first wiring layer 45 is formed and a via hole is formed in a position in which a via 47 is to be provided by a laser processing, and a second wiring layer 46 is then formed by using the same semiadditive process as described above again. In this case, Cu is also deposited in the via hole so that the via 47 is formed.

At the step of forming the build-up wiring layer 48, the semiconductor chip 20 and the stiffener substrate 30 which are integrated by the sealing resin 37 function as support members when the insulating layers 38 and 39 and the wiring layers 45 and 46 are to be formed. Therefore, it is possible to form the insulating layers 38 and 39 and the wiring layers 45 and 46 with high precision. Consequently, it is possible to form the build-up wiring layer 48 with high precision.

As described above, in the embodiment, the transfer molding process is used for forming the sealing resin 37 so that the tape peeling surface is formed as the smooth surface having no concavo-convex portion. When forming the insulating layers 38 and 39 and the wiring layers 45 and 46 which constitute the build-up wiring layer 48, accordingly, it is possible to suppress an occurrence of an exposure shift or a shift of a laser beam irradiating position in the formation of the resist pattern. Therefore, it is possible to form the build-up wiring layer 48 with high precision.

The formation of the sealing resin 37 is not restricted to the transfer molding process but the sealing resin 37 may be formed by sticking a resin sheet or a spin coating process.

Although the build-up wiring layer 48 constituted by the two insulating layers 38 and 39 and the two wiring layers 45 and 46 is taken as an example in the embodiment, moreover, the number of the layers in the build-up wiring layer 48 is not restricted thereto but can be set optionally. Furthermore, it is also possible to form a solder resist on the build-up wiring layer 48 after forming the build-up wiring layer 48, which is not shown.

Figure 8A:
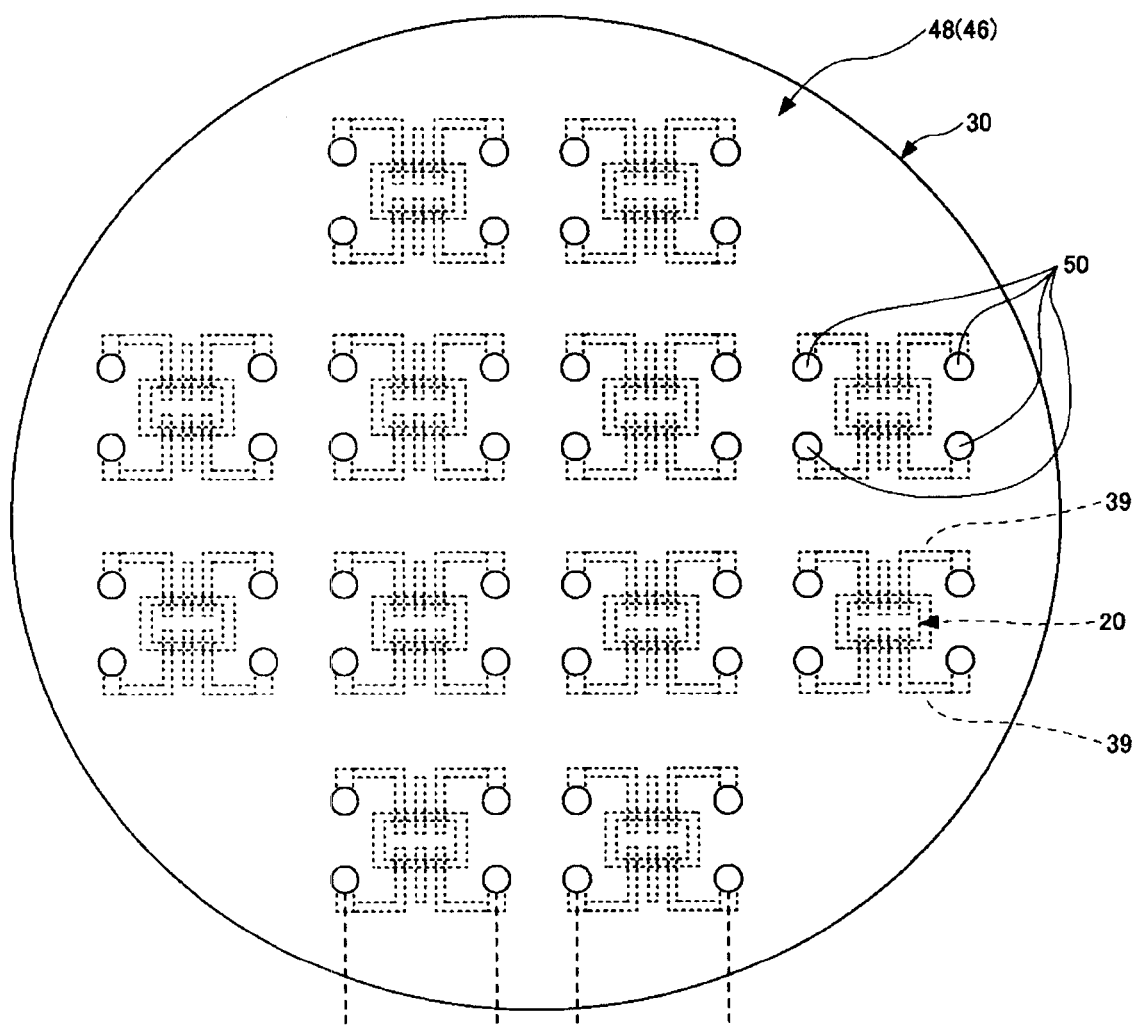
FIGS. 8A and 8B are views (No. 6) for explaining the method of manufacturing a wiring substrate according to the first embodiment of the invention.
Figure 8B:
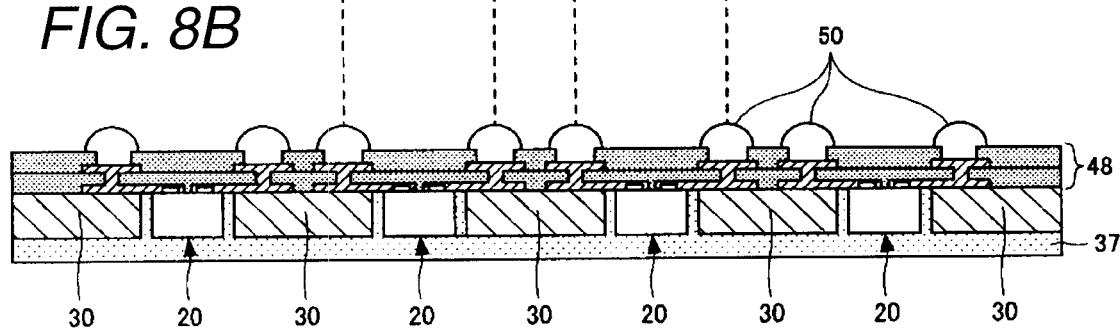

Subsequently, a ball 50 is provided on an opening portion 44 formed on an uppermost layer of the build-up wiring layer 48. The ball 50 functions as an external connecting terminal and a solder ball can be used, for example. FIGS. 8A and 8B show a state in which the ball 50 is provided. FIG. 8A is a plan view showing the stiffener substrate 30 and FIG. 8B is a sectional view showing in the position of the stiffener substrate 30 in which the semiconductor chip 20 is provided.

Figure 9A:
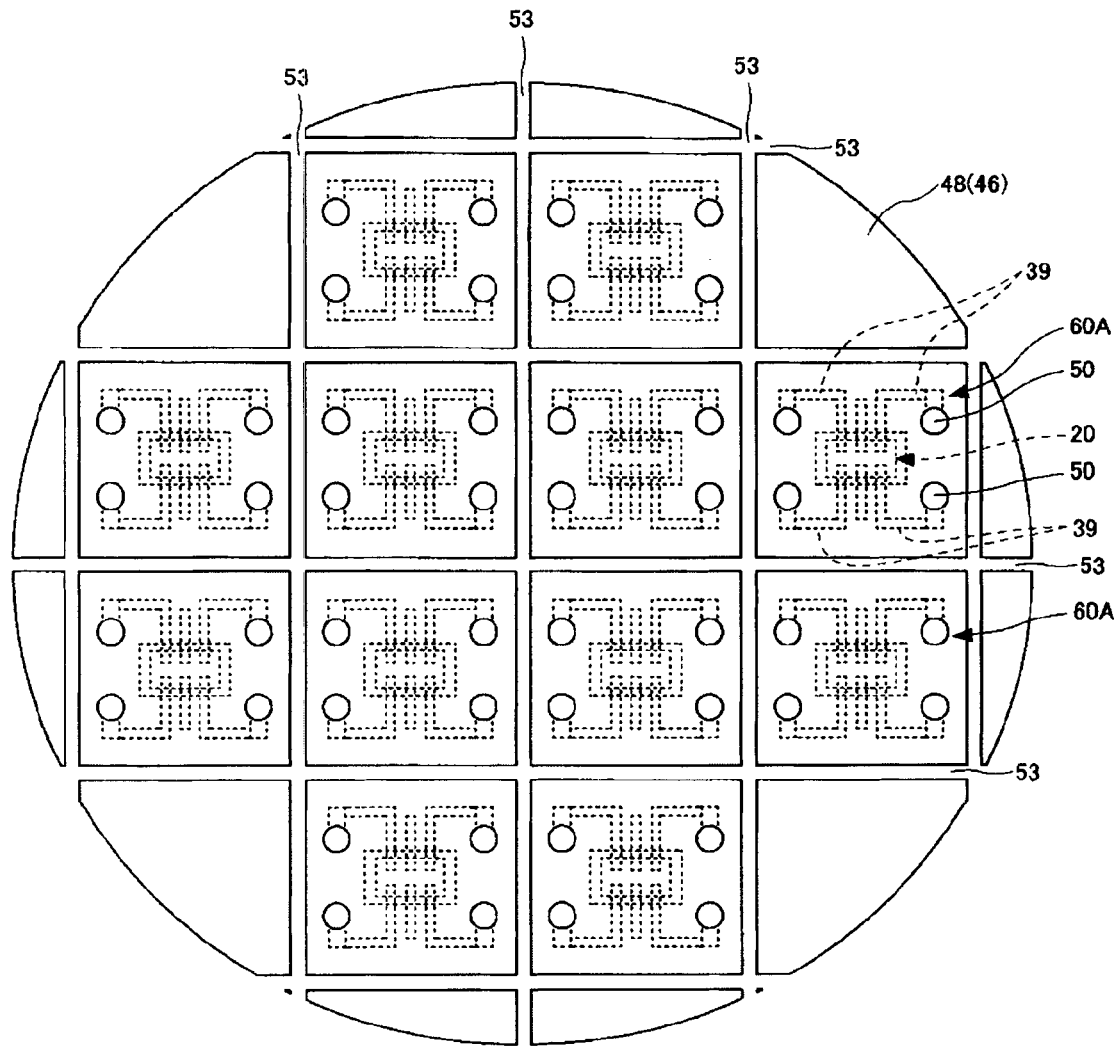
FIGS. 9A and 9B are views (No. 7) for explaining the method of manufacturing a wiring substrate according to the first embodiment of the invention.
Figure 9B:
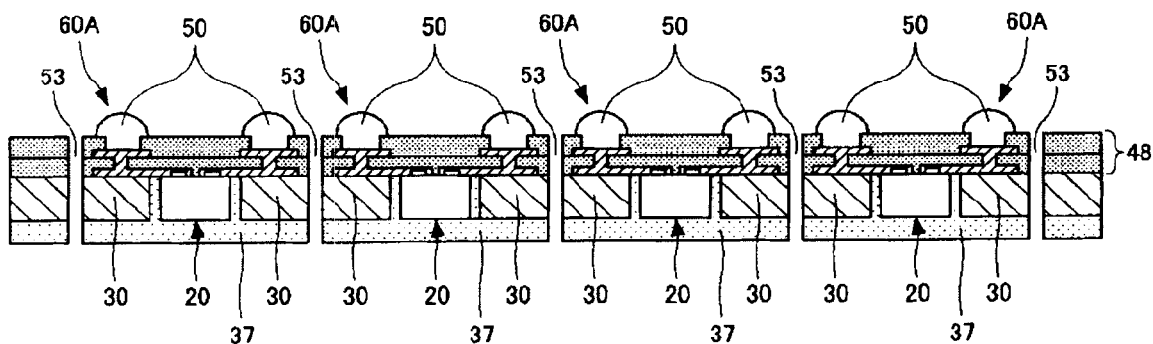

When the ball 50 is formed, the stiffener substrate 30 is subsequently divided into individual pieces on a unit of the wiring substrate 60A as shown in FIGS. 9A and 9B. The division processing is carried out by cutting a dicing line 53 by using a dicing saw. The dicing processing is executed to manufacture the wiring substrate 60A of a so-called chip built-in type in which the semiconductor chip 20 is fixed into the stiffener substrate 30 by the sealing resin 37 and the build-up wiring layer 48 connected to the semiconductor chip 20 is provided.

As described above, according to the embodiment, the semiconductor chip 20 is provided in the cavity 35 formed on the stiffener substrate 30. For this reason, the sealing resin 37 for fixing the semiconductor chip 20 to the stiffener substrate 30 is provided in only the slight clearance formed between the outer wall of the semiconductor chip 20 and the inner wall of the cavity 35.

Even if a contraction is generated when the sealing resin 37 is cured, accordingly, it rarely influences the semiconductor chip 20. Thus, it is possible to reliably connect the semiconductor chip 20 to the first wiring layer 45 (the build-up wiring layer 48) electrically.

Moreover, the build-up wiring layer 48 is mainly formed on the upper surfaces of the stiffener substrate 30 and the semiconductor chip 20 (the tape peeling surface). As compared with the structure in which the build-up wiring layer 7 is formed on the mold resin 5 as in the related-art (see FIGS. 2A to 2D), therefore, the tape peeling surface has a lower surface roughness. When forming the build-up wiring layer 48, therefore, the exposure shift or positional shift can be prevented from being caused by the concavo-convex portion formed on the build-up wiring layer 48. Accordingly, it is possible to form the build-up wiring layer 48 with high precision.

Next, description will be given to a second embodiment according to the invention.

FIGS. 10A to 18B show a method of manufacturing a wiring substrate according to the second embodiment. In FIGS. 10A to 18B, corresponding structures to the structures shown in FIGS. 3A to 9B have the same reference numerals and description thereof will be omitted.

In the second embodiment, also in the case in which the wiring substrate is manufactured, a stiffener substrate 30 formed by a silicon wafer is first prepared as shown in FIG. 10A. Also in the embodiment, a material of the stiffener substrate 30 is not restricted to silicon but it is also possible to use another material which can support (reinforce) a build-up wiring layer 48 and has a small difference in a thermal expansion from the semiconductor chip 20 to be mounted. Moreover, the stiffener substrate 30 is not always the wafer but a material taking a shape other than the wafer may be used.

Next, a polishing processing is executed so that the stiffener substrate 30 is set to have a predetermined thickness L1. Also in the embodiment, the thickness L1 of the stiffener substrate 30 is set to be 200 to 725 μm. Subsequently, a first tape base material 31 is provided through an adhesive 32 on one surface (a lower surface in the drawing) of the stiffener substrate 30 subjected to the polishing processing as shown in FIG. 10B (which corresponds to a first step).

Then, a resist 33 is formed on the stiffener substrate 30 and opening patterns 34 and 40 are formed on the resist 33 as shown in FIG. 10C. A position in which the opening pattern 34 is to be formed corresponds to a position in which a semiconductor chip 20 is to be provided, and a size thereof is set to be slightly larger than a shape of the semiconductor chip 20. Moreover, a diameter of the opening pattern 40 is set to correspond to that of a through electrode 68 which will be described below. The diameter of the through electrode 68 is approximately 50 to 100 μm, for example.

Subsequently, the resist 11 is cured by heating, and is then used as a mask to execute a dry etching processing over the stiffener substrate 30. By executing the dry etching processing, a cavity 35 and a through hole 41 are formed on the stiffener substrate 30 (which corresponds to a second step). FIG. 10D shows a state in which the cavity 35 and the through hole 41 are formed on the stiffener substrate 30. The cavity 35 and the through hole 41 are formed to penetrate the stiffener substrate 30. Consequently, the first tape base material 31 is exposed from bottom parts of the cavity 35 and the through hole 41.

As an etching gas to be used for the dry etching process, for example, it is possible to use carbon tetrafluoride ($CF_4$). Although it is possible to use plasma etching or reactive ion etching (RIE) as the etching process, moreover, it is desirable to use the RIE in order to form the through hole 41 having a small diameter in the embodiment.

The cavity 35 formed on the stiffener substrate 30 fulfills a function for accommodating the semiconductor chip 20 therein. For this reason, the cavity 35 is set to have such a size as to reliably accommodate the semiconductor chip 20 in the cavity 35. Also in the embodiment, the first and second steps may have order exchanged.

When the cavity 35 and the opening pattern 40 are formed on the stiffener substrate 30, thus, the resist 33 is removed by ashing as shown in FIG. 10E. Subsequently, an ultraviolet light is irradiated to cure the adhesive 32, thereby reducing an adhesive strength. When the adhesive strength is reduced, then, the first tape base material 31 is peeled from the semiconductor chip 20 and the stiffener substrate 30.

Figure 11A:
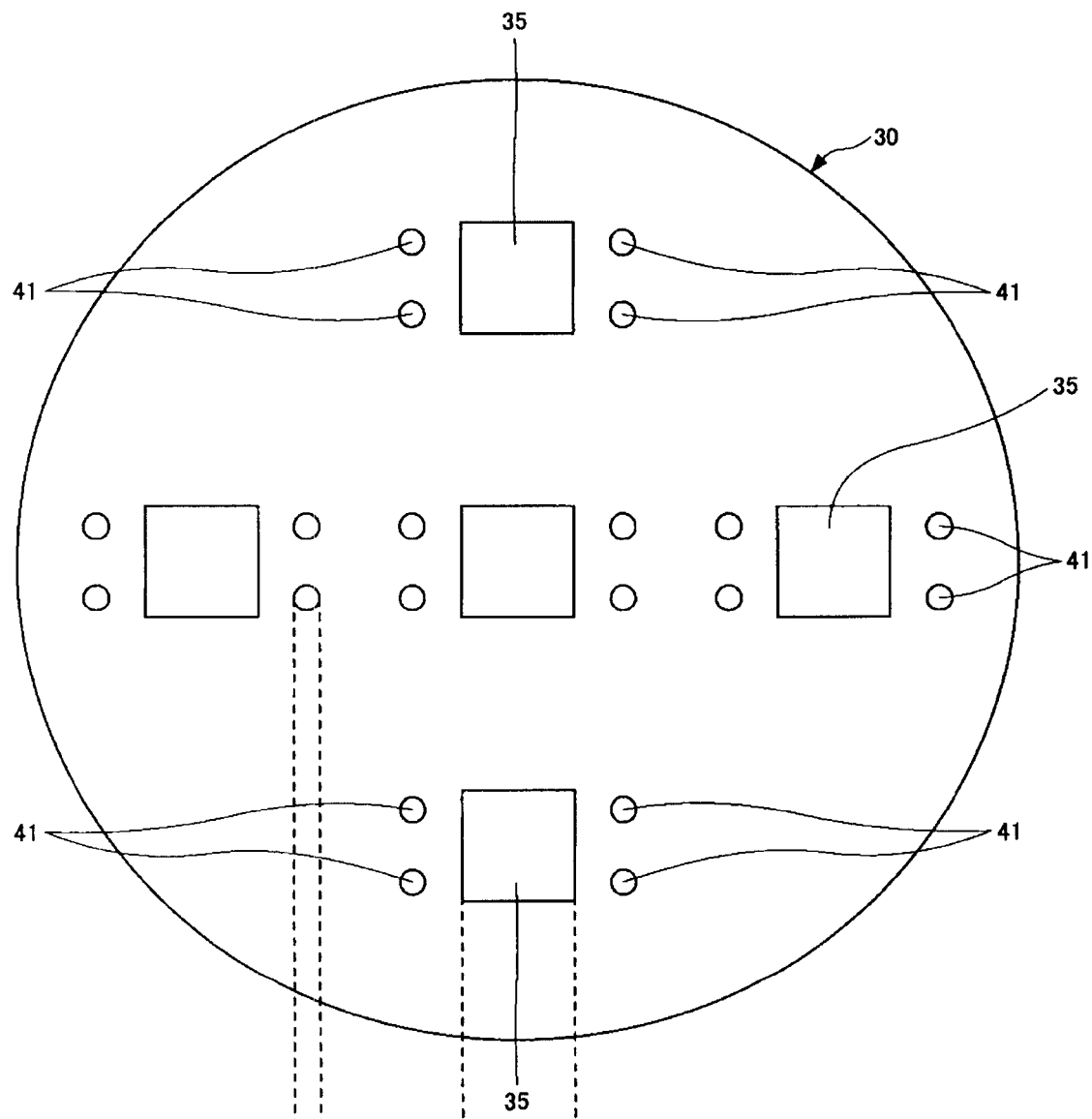
FIGS. 11A and 11B are views (No. 2) for explaining the method of manufacturing a wiring substrate according to the second embodiment of the invention.
Figure 11B:
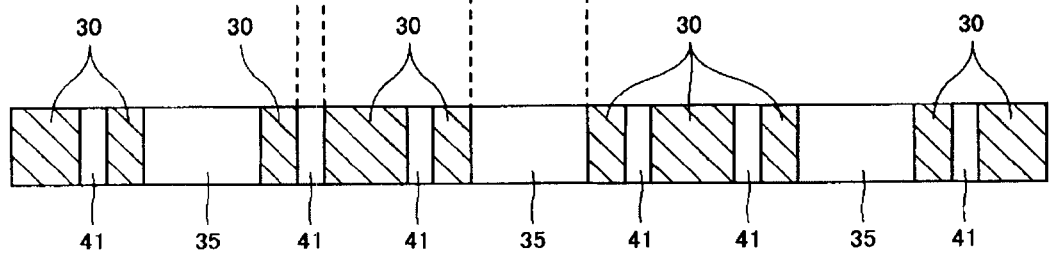

FIGS. 11A and 11B show a state in which the first tape base material 31 is removed from the stiffener substrate 30. FIG. 11A is a plan view showing the stiffener substrate 30 and the FIG. 11B is a sectional view showing in the positions of the stiffener substrate 30 in which the cavity 35 and the through hole 41 are formed.

When the formation of the cavity 35 and the through hole 41 on the stiffener substrate 30 is ended as described above, a processing for forming the through electrode 68 in the through hole 41 (see FIG. 14D) is subsequently executed (which corresponds to a through electrode forming step). A processing for forming the through electrode 68 will be described below with reference to FIGS. 12A to 14D.

In order to form the through electrode 68, first of all, an oxide film 54 is formed on a surface of the stiffener substrate 30 on which the cavity 35 and the through hole 41 are provided. The oxide film 54 is a silicon oxide film ($SiO_2$) and can be formed by attaching the stiffener substrate 30 to a thermal oxidation furnace to carry out a heat treatment.

Figure 12A:
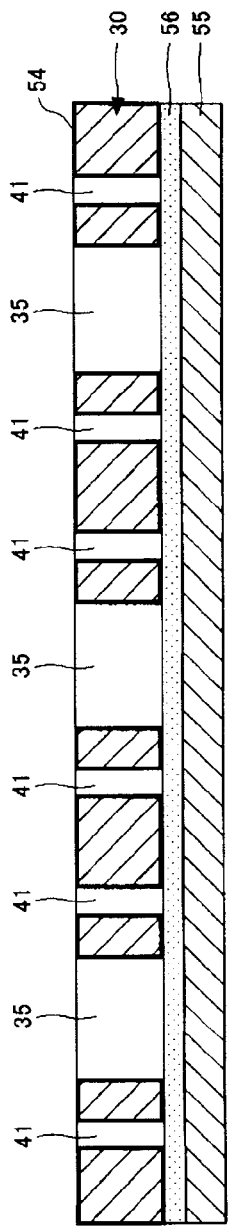
FIGS. 12A to 12D are views (No. 3) for explaining the method of manufacturing a wiring substrate according to the second embodiment of the invention.

When the oxide film 54 is formed on the surface of the stiffener substrate 30, a Cu plate 55 having an adhesive 56 applied thereto is then stuck to one surface of the stiffener substrate 30 (a lower surface in the drawing in the embodiment) on which the cavity 35 and the through hole 41 are formed as shown in FIG. 12A. The adhesive 56 is a resin based adhesive, for example, and a material having a high adhesion property is selected for both the Cu plate 55 formed of Cu (metal) and the stiffener substrate 30 formed of silicon.

Figure 12B:
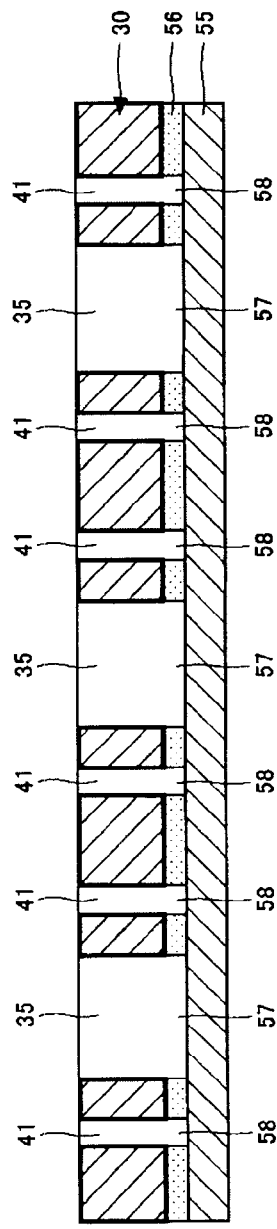

When the Cu plate 55 is stuck to the stiffener substrate 30, thus, an ashing processing is then executed for the adhesive 56 exposed to the cavity 35 and the through hole 41 to form openings 57, 58 in the adhesive 56. As shown in FIG. 12B, consequently, the Cu plate 55 is exposed in the positions in which the cavity 35 and the through hole 41 are formed. For the ashing processing, similarly, it is possible to use a plasma ashing device utilizing an oxygen plasma, for example.

Figure 12C:
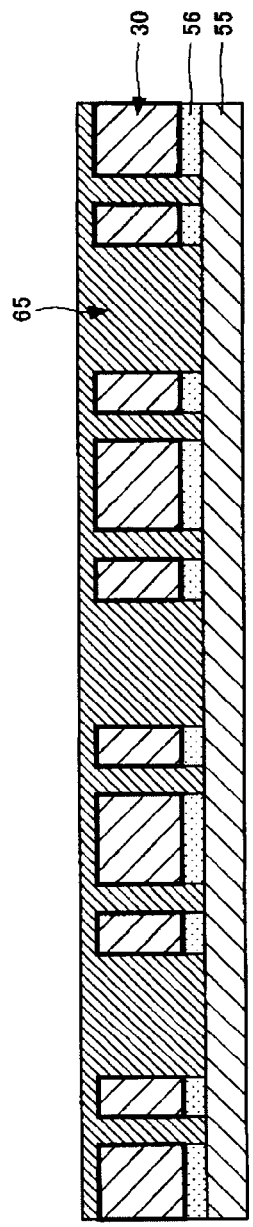

Next, an electrolytic Cu plating processing is executed by using the Cu plate 55 as a seed electrode. Consequently, an electrolytic Cu plated layer 65 is formed on inner parts of the cavity 35 and the through hole 41 and an upper part of the stiffener substrate 30. FIG. 12C shows a state in which the electrolytic Cu plated layer 65 is formed.

Figure 12D:
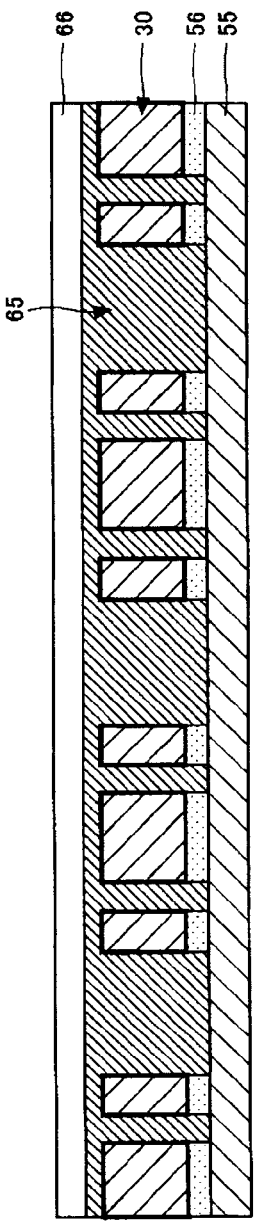

As shown in FIG. 12D, next, a second tape base material 66 is stuck to an upper surface of the electrolytic Cu plated layer 65 which is formed (a surface on an opposite side to a side on which the Cu plate 55 is provided). An adhesive (formed by an UV curing resin) is previously applied to the second tape base material 66, which is not shown.

Subsequently, a processing for removing the Cu plate 55 is executed. In the embodiment, there is employed a method of removing the Cu plate 55 through a wet etching process. As an etchant to be used for the wet etching, it is possible to propose use of a ferric chloride solution, a cupric chloride solution or an ammonium persulfate solution, for example.

Figure 13A:
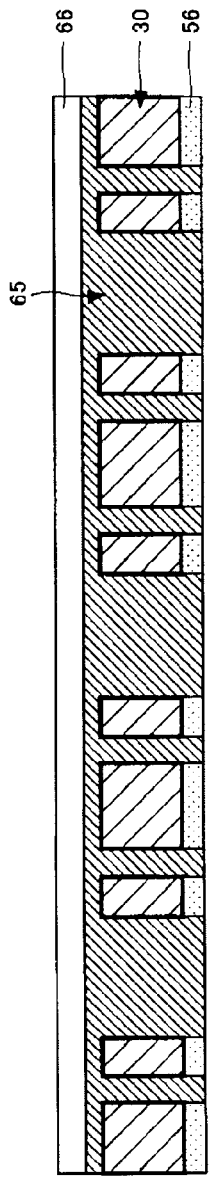
FIGS. 13A to 13E are views (No. 4) for explaining the method of manufacturing a wiring substrate according to the second embodiment of the invention.

FIG. 13A shows a state in which the Cu plate 55 is removed through the wet etching. The Cu plate 55 is removed so that parts of the adhesive 56 and the electrolytic Cu plated layer 65 are exposed to an outside. Next, the ashing processing is executed to carry out a processing for removing the adhesive 56.

Figure 13B:
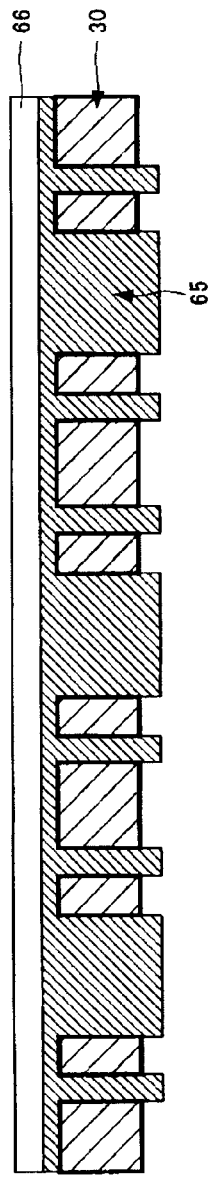
Figure 13C:
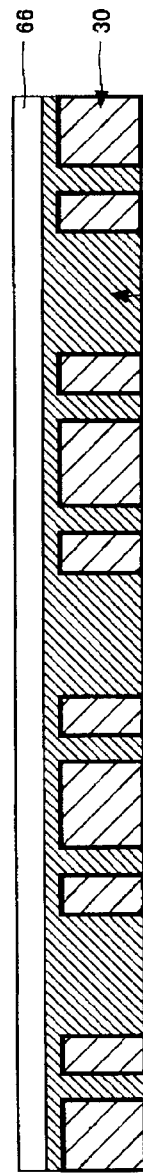

FIG. 13B shows a state in which the adhesive 56 is removed. As shown in FIG. 13B, the adhesive 56 is removed so that concavo-convex portions are formed on the lower surface of the stiffener substrate 30 in the drawing. For this reason, CMP (Chemical Mechanical Polishing) is subsequently executed to flatten the lower surface of the stiffener substrate 30 in the drawing. As shown in FIG. 13C, consequently, the lower surface of the stiffener substrate 30 in the drawing is flattened. Thus, the lower surface of the stiffener substrate 30 and that of the electrolytic Cu plated layer 65 are flattened without the concavo-convex portion with high precision.

Figure 13D:

Next, an ultraviolet light is irradiated on the second tape base material 66 to cure the adhesive formed by the UV curing resin which is not shown, thereby reducing an adhesive strength. Subsequently, the second tape base material 66 is peeled from the stiffener substrate 30. FIG. 13D shows a state in which the stiffener substrate 30 is peeled.

In the state in which the second tape base material 66 is peeled, the stiffener substrate 30 is covered with the electrolytic Cu plated layer 65. For this reason, the CMP is executed over a surface from which the second tape base material 66 is peeled and to which Cu is exposed (which will be hereinafter referred to as a Cu exposed surface) in order to expose the stiffener substrate 30. The CMP is executed until the stiffener substrate 30 is exposed.

Figure 13E:
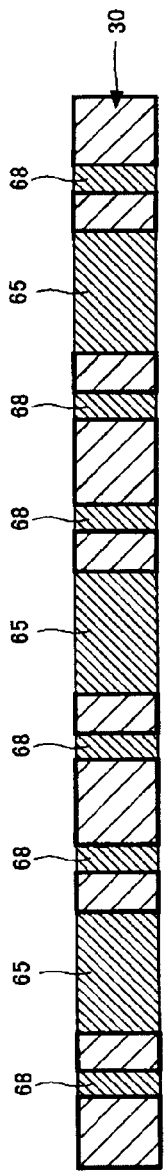

FIG. 13E shows a state in which the stiffener substrate 30 is exposed through the CMP. Thus, the stiffener substrate 30 is exposed so that the electrolytic Cu plated layer 65 in the cavity 35 and the electrolytic Cu plated layer 65 in a first insulating layer 38 are electrically independent. More specifically, the through electrode 68 is formed in the first insulating layer 38. The electrolytic Cu plated layer 65 formed in the first insulating layer 38 will be hereinafter referred to as the through electrode 68.

Figure 14A:
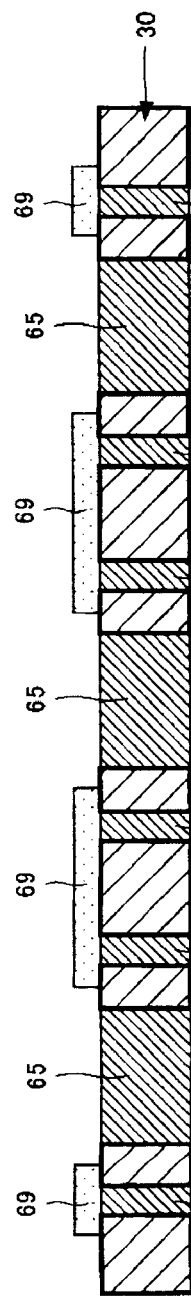
FIGS. 14A to 14D are views (No. 5) for explaining the method of manufacturing a wiring substrate according to the second embodiment of the invention.

When the through electrode 68 is formed as described above, a resist 69 is formed on upper surfaces of the stiffener substrate 30, the electrolytic Cu plated layer 65 and the through electrode 68, and furthermore, patterning is carried out in such a manner that an upper end of the through electrode 68 is covered with the resist 69. FIG. 14A shows a state in which the resist 69 covering the upper end of the through electrode 68 is formed.

Subsequently, a third tape base material 70 is stuck to a surface (the lower surface in the drawing) of the stiffener substrate 30 at an opposite side to the surface on which the resist 69 is provided. A UV curing adhesive (not shown) is also applied to a surface of the third tape base material 70, and the third tape base material 70 is stuck to the stiffener substrate 30 with the adhesive.

Figure 14B:
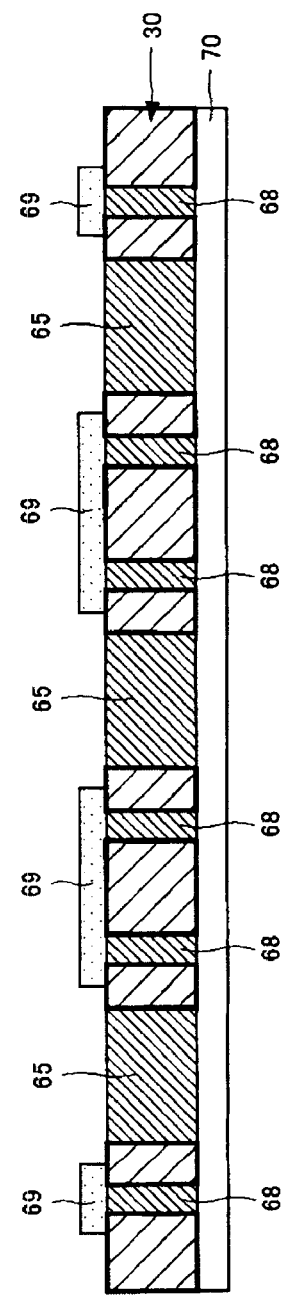

As a material of the third tape base material 70, moreover, there is selected a material having a high resistance to an etchant to be used in an etching processing which will be described below. FIG. 14B shows a state in which the third tape base material 70 is stuck to the lower surface of the stiffener substrate 30.

Subsequently, a processing for removing the electrolytic Cu plated layer 65 is executed. In the embodiment, there is employed a method of removing the electrolytic Cu plated layer 65 through a wet etching process. As an etchant to be used for the wet etching, it is possible to propose use of a ferric chloride solution, a cupric chloride solution or an ammonium persulfate solution, for example.

Figure 14C:
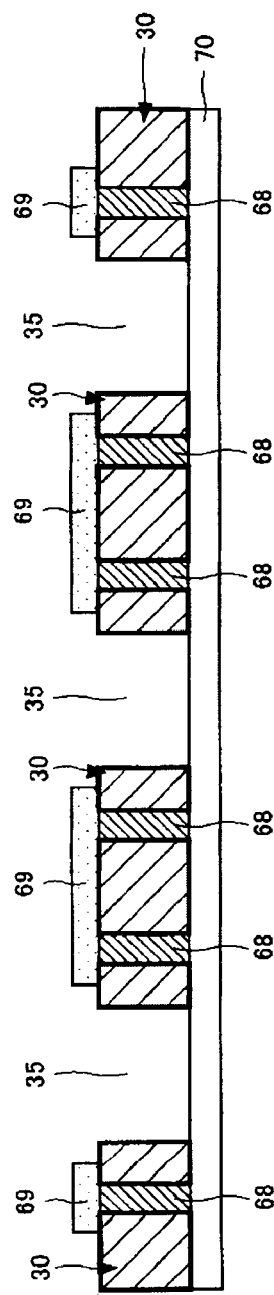

FIG. 14C shows a state in which the electrolytic Cu plated layer 65 is removed. The electrolytic Cu plated layer 65 is removed so that the cavity 35 is formed on the stiffener substrate 30 again. Although the through electrode 68 is formed of Cu, moreover, the upper end is covered with the resist 69 and a lower end is covered with the third tape base material 70. Therefore, the through electrode 68 can be prevented from being corroded even if the wet etching is executed as described above.

Figure 14D:
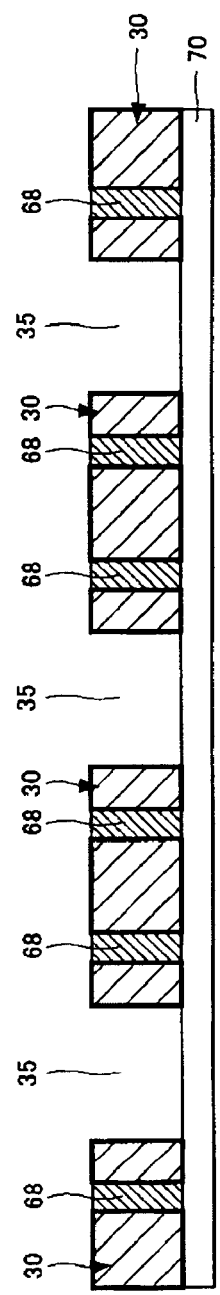

When the cavity 35 is formed again, thus, the resist 69 is removed by the ashing as shown in FIG. 14D. By executing the processing, the processing for forming the through electrode 68 in the through hole 41 (a through electrode forming step) is ended.

Figure 15A:
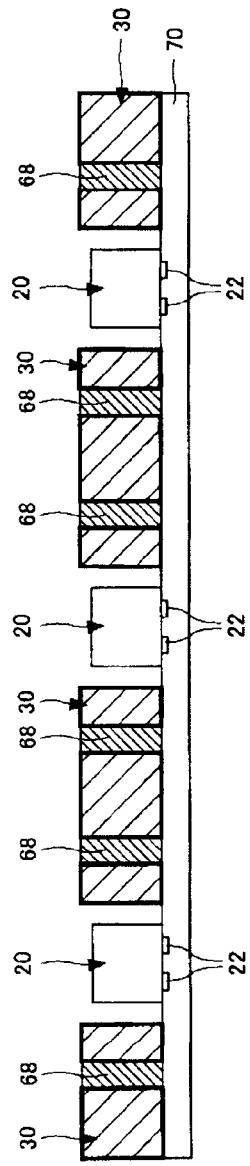
FIGS. 15A to 15D are views (No. 6) for explaining the method of manufacturing a wiring substrate according to the second embodiment of the invention.

When the through electrode forming step is ended, the semiconductor chip 20 is subsequently inserted into the cavity 35 formed on the stiffener substrate 30 and is stuck to the third tape base material 70 as shown in FIG. 15A (which corresponds to a third step).

Also in the embodiment, the semiconductor chip 20 is attached into the cavity 35 facedown. Accordingly, a pad 22 formed on a main surface of the semiconductor chip 20 is opposed to the third tape base material 70.

Also in the embodiment, a size of the cavity 35 is set to be slightly larger than that of the semiconductor chip 20. Accordingly, the semiconductor chip 20 can easily be attached into the cavity 35. Moreover, it is possible to prevent a shift from being generated in the position in which the semiconductor chip 20 is to be provided over the position in which the cavity 35 is to be formed.

When the semiconductor chip 20 is provided in the cavity 35 as described above, the stiffener substrate 30 and the semiconductor chip 20 which are stuck to the third tape base material 70 are attached to a metal mold. In a heating and pressurizing environment, a sealing resin 37 is then molded (which corresponds to a fourth step).

Figure 15B:
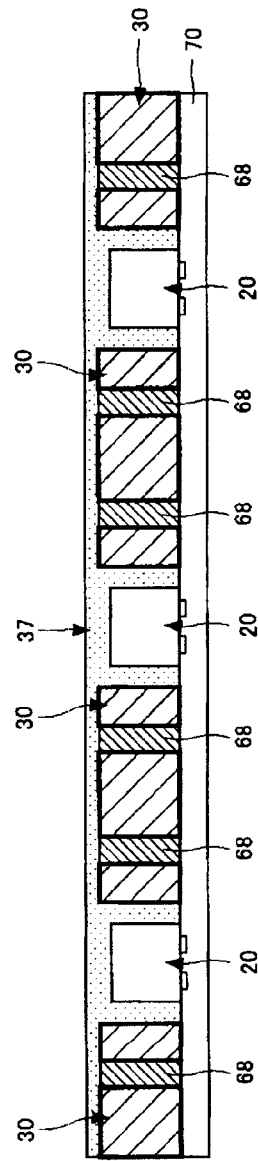

The sealing resin 37 is provided in the cavity 35 and is formed to cover upper surfaces of the semiconductor chip 20 and the stiffener substrate 30. FIG. 15B shows a state in which the sealing resin 37 is formed. By forming the sealing resin 37, the semiconductor chip 20 and the stiffener substrate 30 are sealed in the sealing resin 37. Moreover, the sealing resin 37 causes the semiconductor chip 20 and the stiffener substrate 30 to be fixed through the sealing resin 37. More specifically, the sealing resin 37 also functions as an adhesive for fixing the semiconductor chip 20 and the stiffener substrate 30.

When the sealing resin 37 is to be formed, a thermal contraction is generated on the sealing resin 37 as described above. Also in the embodiment, however, the semiconductor chip 20 is provided in the cavity 35 formed on the stiffener substrate 30 and the sealing resin 37 is provided in the slight clearance formed between the outer wall of the semiconductor chip 20 and the inner wall of the cavity 35 in the same manner as in the first embodiment. Therefore, an influence of the thermal contraction of the sealing resin 37 is small and the position in which the semiconductor chip 20 is provided can be prevented from being shifted greatly.

Moreover, the semiconductor chip 20 is provided in the cavity 35 formed on the stiffener substrate 30. Therefore, the semiconductor chip 20 is protected by the stiffener substrate 30. Moreover, the semiconductor chip 20 and the stiffener substrate 30 are formed by the same material, that is, silicon.

Therefore, a difference in a thermal expansion is not made and a stress can be prevented from being generated between the semiconductor chip 20 and the stiffener substrate 30.

Also in the embodiment, furthermore, a material to be used for the sealing resin 37 has a coefficient of elasticity of 100 MPa or higher and 3000 MPa or lower. Even if the stress is generated in the wiring substrate, therefore, the stress can be buffered by the sealing resin 37.

As the method of forming the sealing resin 37, moreover, a transfer molding process is used. Therefore, the sealing resin 37 can also be filled reliably in the slight clearance provided between the outer wall of the semiconductor chip 20 and the inner wall of the cavity 35. Accordingly, it is possible to prevent a concavo-convex portion from being generated on a tape peeling surface which will be described below, thereby enhancing precision in the build-up wiring layer 48 formed thereon.

Figure 15C:
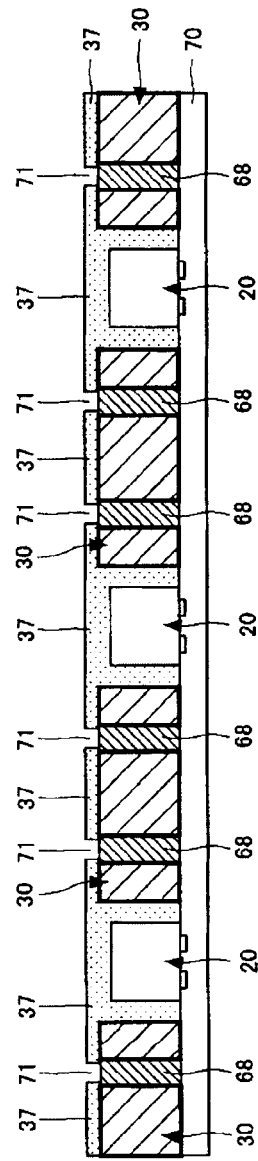

When the sealing resin 37 is formed as described above, an opening portion 71 is formed in a position of the sealing resin 37 which is opposed to the through electrode 68. The opening portion 71 may be formed by a laser processing or may be formed by carrying out patterning after disposing a resist and performing ashing using the resist as a mask. FIG. 15C shows a state in which the opening portion 71 is formed on the sealing resin 37.

Subsequently, a back wiring layer 72 formed of Cu is provided on the sealing resin 37 on which the opening portion 71 is formed. The back wiring layer 72 is formed by using a semiadditive process. More specifically, a catalytic treatment is carried out over the sealing resin 37 including an inner part of the opening portion 71 and electroless Cu plating is subsequently performed to form a seed layer.

Figure 15D:
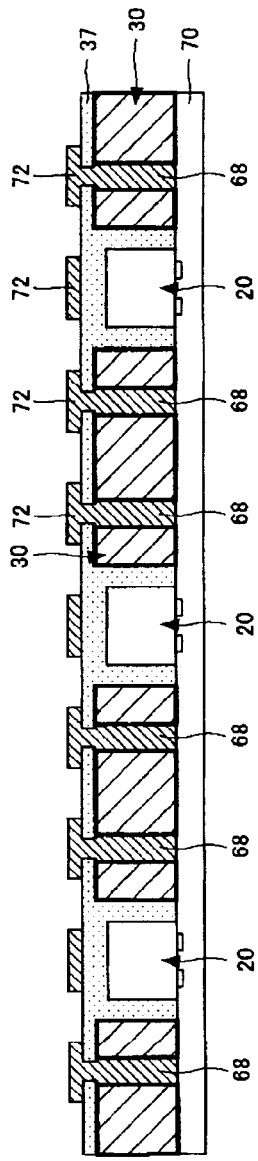

Next, a resist having an opening pattern corresponding to a shape of the back wiring layer 72 is formed on the sealing resin 37. Thereafter, electrolytic Cu plating is executed by, using the seed layer as a feeding layer so that the back wiring layer 72 is formed in the opening pattern. The electrolytic Cu plating is also carried out over the inner part of the opening portion 71. Therefore, the back wiring layer 72 is electrically connected to the through electrode 68. FIG. 15D is a view showing a state in which the back wiring layer 72 is formed.

When the back wiring layer 72 is formed, a passivation film 73 is formed on the surface of the sealing resin 37 on which the back wiring layer 72 is provided. FIG. 16A shows a state in which the passivation film 73 is formed. The passivation film 73 has an opening portion 74 formed in an opposed position to the back wiring layer 72. Accordingly, a part of the back wiring layer 72 is exposed from the opening portion 74 formed on the passivation film 73.

As a method of forming the passivation film 73, it is possible to propose a method of forming a silicon oxide film or a silicon nitride film by using a CVD process and then forming the opening portion 74. Moreover, a solder resist formed by a resin can also be used in place of the passivation film 73.

When the passivation film 73 is formed as described above, a heat treatment is carried out to cure an adhesive applied to the third tape base material 70, thereby reducing an adhesive strength. When the adhesive strength is reduced, the third tape base material 70 is peeled from the semiconductor chip 20 and the stiffener substrate 30. FIG. 16B shows a state in which the third tape base material 70 is peeled.

In the peeling operation, also in the embodiment, the sealing resin 37 is formed by using the transfer molding process. Therefore, the sealing resin 37 is reliably filled in the slight clearance provided between the outer wall of the semiconductor chip 20 and the inner wall of the cavity 35. When the third tape base material 70 is peeled, consequently, the tape peeling surface can be a smooth surface having no concavo-convex portion.

Subsequently, the stiffener substrate 30 is vertically inverted as shown in FIG. 16C. Consequently, the pad 22 of the semiconductor chip 20 is positioned in an upper part and a first wiring layer 45 is formed on the pad 22. The first wiring layer 45 is formed by using the semiadditive process.

More specifically, a catalytic treatment is carried out over the tape peeling surface (the upper surfaces of the semiconductor chip 20, the stiffener substrate 30 and the sealing resin 37 in the drawing) and the electroless Cu plating is then performed to form a seed layer.

Next, a resist having an opening pattern corresponding to a shape of the first wiring layer 45 is formed on the tape peeling surface. Then, the electrolytic Cu plating is executed by using the seed layer as a feeding layer so that the first wiring layer 45 is formed in the opening pattern. In this case, the pad 22 of the semiconductor chip 20 and the first wiring layer 45 are directly bonded to each other without a bump.

When the first wiring layer 45 is thus formed, the resist is peeled and the unnecessary seed layer is removed. Consequently, the first wiring layer 45 shown in FIG. 16C is formed. The catalyst, the seed layer and the resist are not shown.

When the first wiring layer 45 is formed, an insulating layer and a wiring layer are alternately stacked on a first insulating layer 38 by using a build-up process and an via used to join the respective layers is formed so that a build-up wiring layer 48 including the first wiring layer 45 is formed (which corresponds to a fifth step). FIG. 16D shows a state in which the build-up wiring layer 48 is formed. In the same manner as in the first embodiment, the build-up wiring layer 48 according to the embodiment is constituted by the first insulating layer 38, a second insulating layer 39, the first wiring layer 45 and a second wiring layer 46.

At the step of forming the build-up wiring layer 48, the stiffener substrate 30 functions as a support member when the insulating layers 38 and 39 and the wiring layers 45 and 46 are to be formed. Therefore, it is possible to form the insulating layers 38 and 39 and the wiring layers 45 and 46 with high precision. Consequently, it is possible to form the build-up wiring layer 48 with high precision.

Moreover, the transfer molding process is used for forming the sealing resin 37. Therefore, the tape peeling surface is formed as the smooth surface having no concavo-convex portion. In the same manner as in the first embodiment, accordingly, it is possible to form the build-up wiring layer 48 with high precision.

Although the build-up wiring layer 48 constituted by the two insulating layers 38 and 39 and the two wiring layers 45 and 46 is taken as an example in the embodiment, the number of the layers in the build-up wiring layer 48 is not restricted thereto but can be set optionally. Moreover, it is also possible to form a solder resist on the build-up wiring layer 48 after forming the build-up wiring layer 48, which is not shown.

Subsequently, a ball 50 is provided on an opening portion 44 formed on an uppermost layer of the build-up wiring layer 48 and a ball 51 is provided on the passivation film 73 to the back wiring layer 72 which are formed on the lower surface.

Figure 17A:
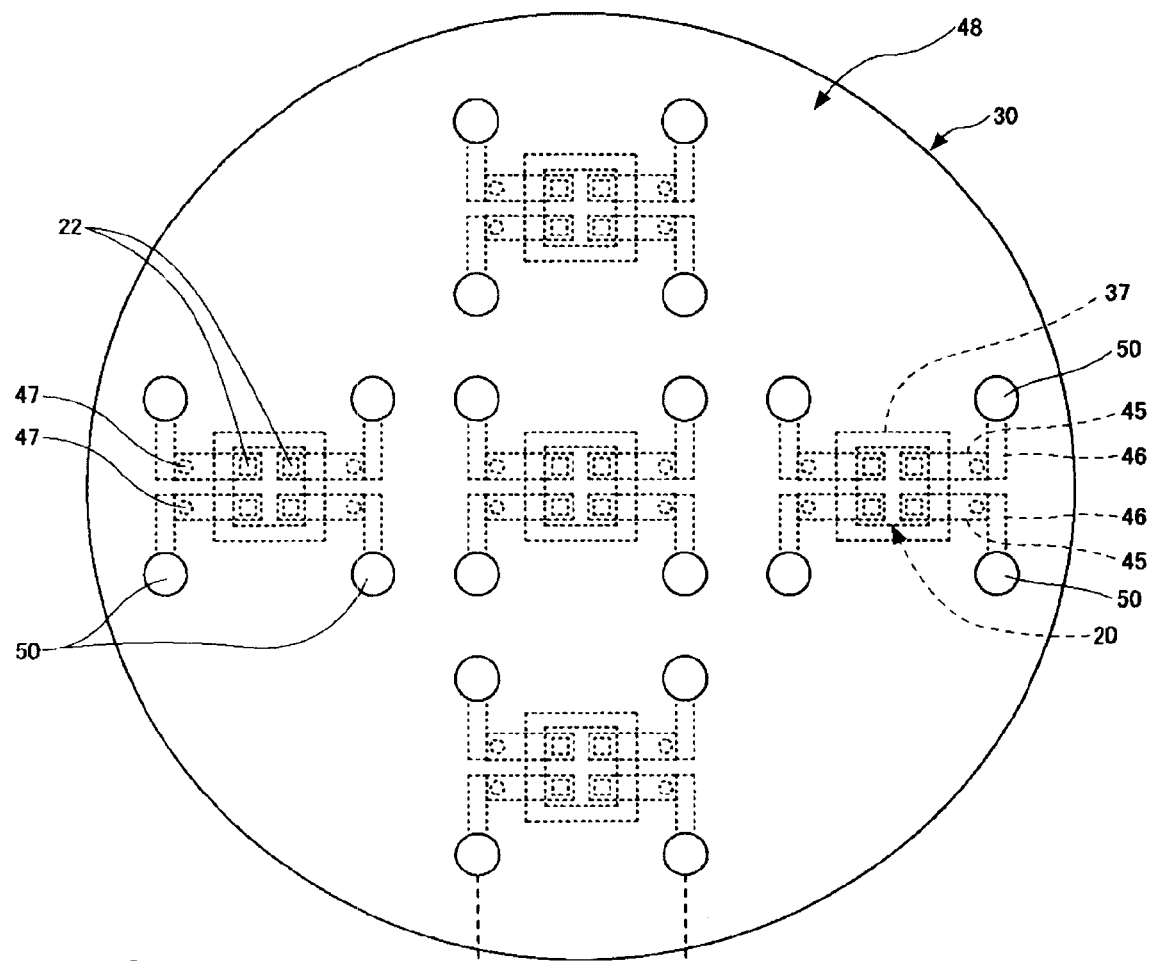
FIGS. 17A and 17B are views (No. 8) for explaining the method of manufacturing a wiring substrate according to the second embodiment of the invention.
Figure 17B:
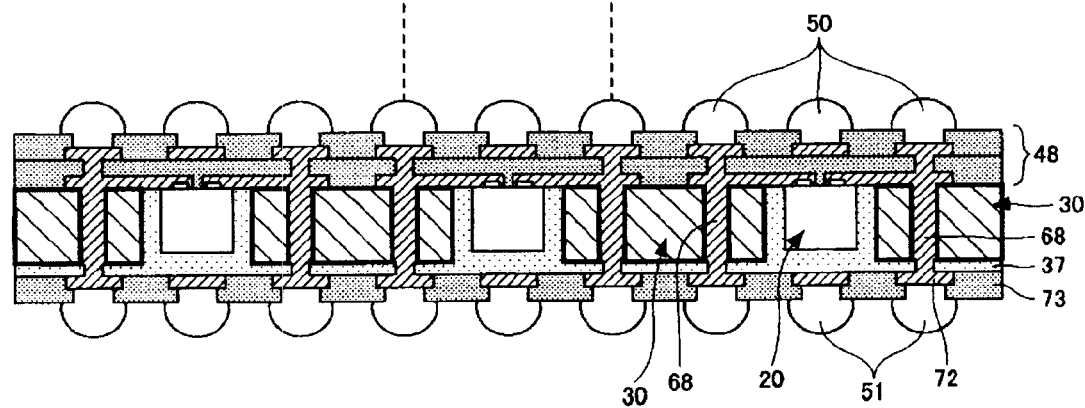

The balls 50 and 51 function as external connecting terminals and a solder ball can be used, for example. FIGS. 17A and 17B show a state in which the balls 50 and 51 are provided. FIG. 17A is a plan view showing the stiffener substrate 30 and FIG. 17B is a sectional view in the position of the stiffener substrate 30 in which the semiconductor chip 20 is provided.

Figure 18A:
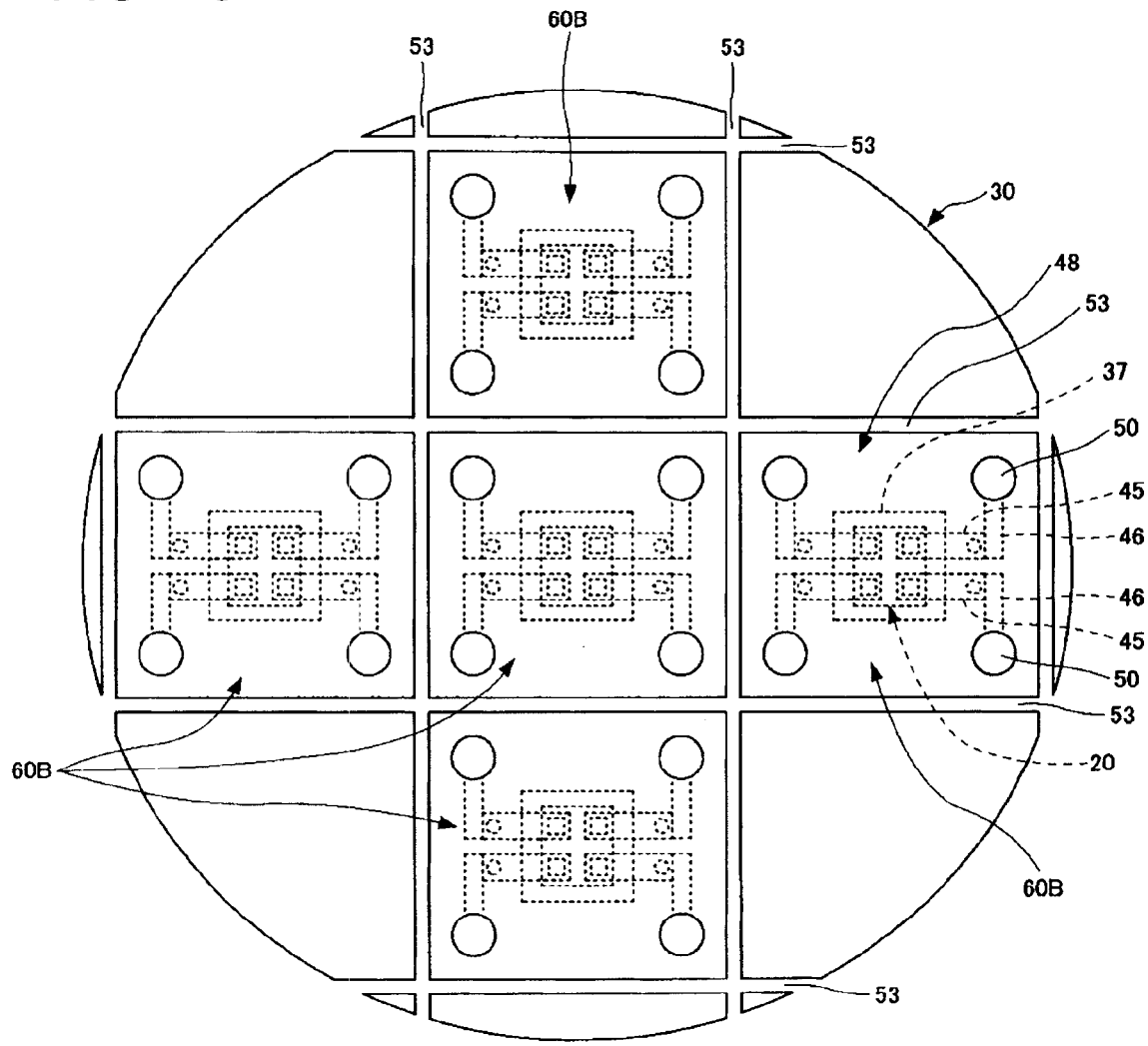
FIGS. 18A and 18B are views (No. 9) for explaining the method of manufacturing a wiring substrate according to the second embodiment of the invention.
Figure 18B:
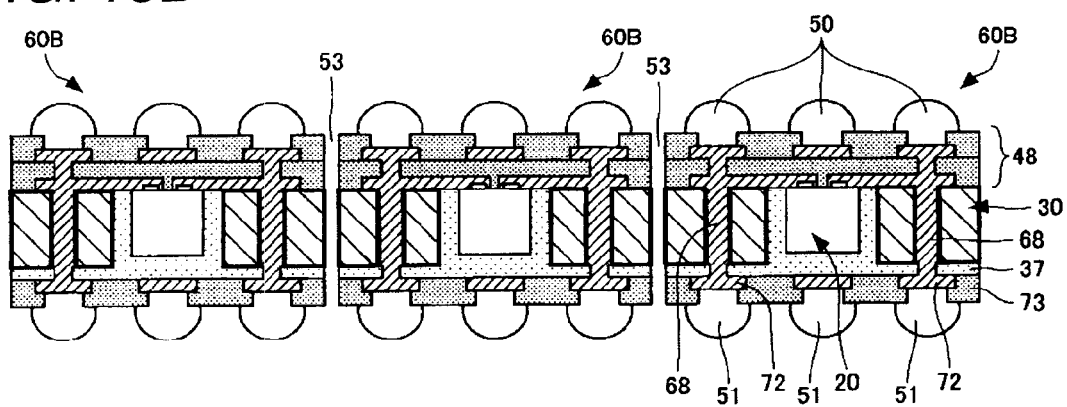

When the balls 50 and 51 are formed, the stiffener substrate 30 is subsequently divided into individual pieces on a unit of the wiring substrate 60B as shown in FIGS. 18A and 18B. The division processing is carried out by cutting a dicing line 53 by using a dicing saw. The dicing processing is executed so that the wiring substrate 60B of a so-called chip built-in type is manufactured.

As described above, also in the embodiment, the semiconductor chip 20 is provided in the cavity 35 formed on the stiffener substrate 30. Even if a contraction is generated when the sealing resin 37 is cured, accordingly, it rarely influences the semiconductor chip 20. Thus, it is possible to reliably connect the semiconductor chip 20 to the first wiring layer 45 (the build-up wiring layer 48) electrically. Moreover, the build-up wiring layer 48 is formed on the tape peeling surface having a low surface roughness. Therefore, it is possible to form the build-up wiring layer 48 with high precision.

Figure 19:
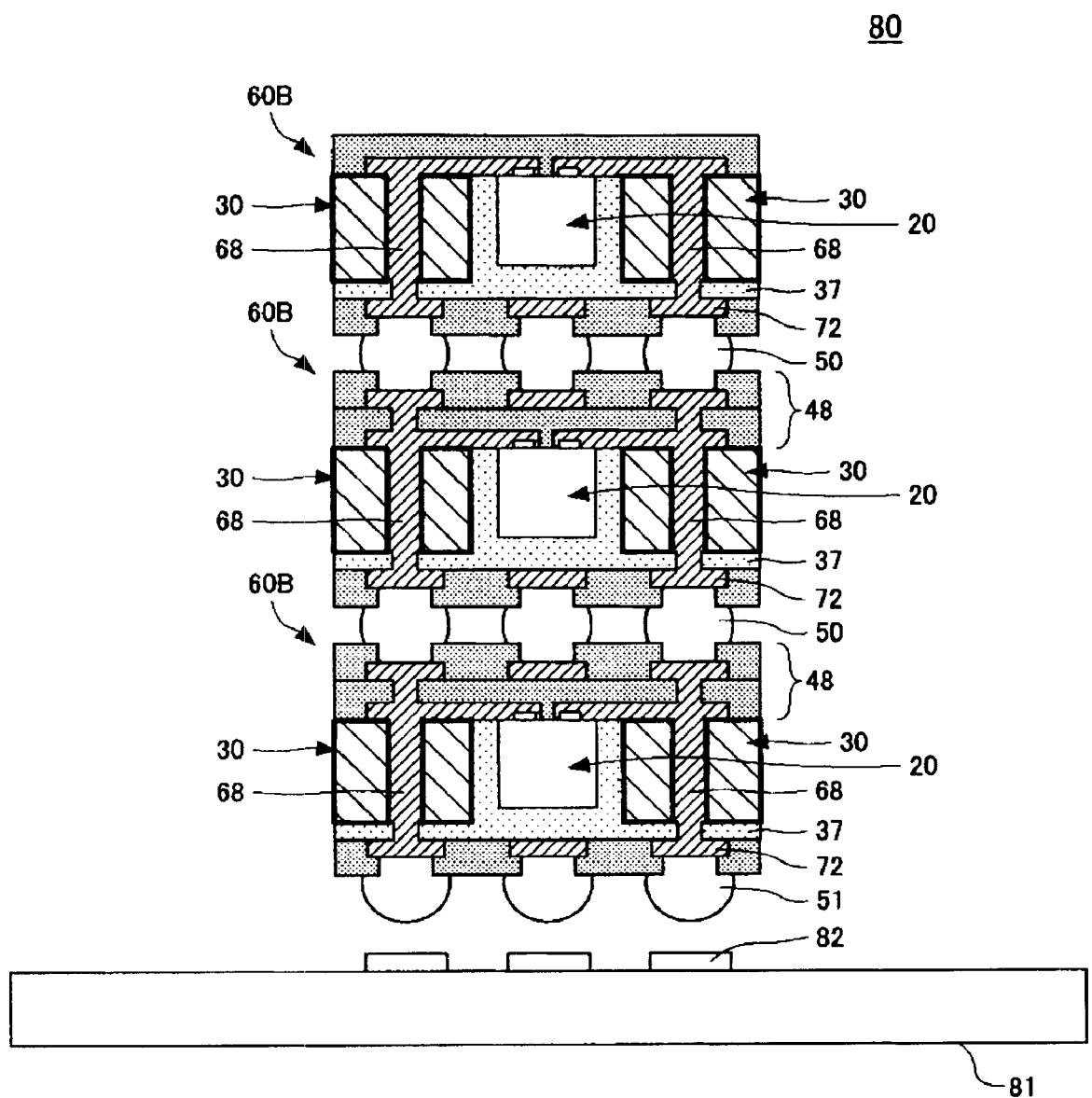
FIG. 19 is a view showing an electronic device in which the wiring substrate manufactured by the wiring substrate manufacturing method according to the second embodiment is stacked.

In the wiring substrate 60A manufactured according to the embodiment, furthermore, the through electrode 68 is formed on the stiffener substrate 30. As shown in FIG. 19, therefore, it is possible to easily stack the wiring substrates 60B. Thus, it is possible to readily implement an electronic device 80 having a higher density.

Although the description has been given by taking, as an example, the method of forming the cavity 35 and the through hole 41 at the same time in the second embodiment, it is also possible to employ a method of preparing the stiffener substrate 30 having only the through hole 41 formed previously thereon and forming the through electrode 68 on the through hole 41, and then etching the stiffener substrate 30 newly to form the cavity 35.

While the preferred examples according to the invention have been described below in detail, the invention is not restricted to the specific embodiments but various modifications and changes can be made without departing from the scope of the invention described in the claims.

What is claimed is:

1. A method of manufacturing a wiring substrate, comprising:
   a first step of providing a tape member on a first surface of a reinforcing substrate, the reinforcing substrate being formed by a material having a coefficient of thermal expansion which is equal to that of the chip component;
   a second step of forming, on the reinforcing substrate, a through opening for accommodating a chip component therein;
   a third step of inserting the chip component in the through opening and providing the chip component on the tape member, the chip component having a main surface on which at least one circuit component is provided, and the chip component being provided on the tape member such that the main surface of the chip component is flush with the first surface of the reinforcing substrate;
   a fourth step of sealing the reinforcing substrate and the chip component with a resin by forming the resin to cover an entirety of a second surface of the reinforcing substrate, said second surface of the reinforcing substrate being opposite to said first surface of the reinforcing substrate; and
   a fifth step of removing the tape member and forming a build-up layer having an insulating layer and a wiring layer stacked on a surface from which the tape member is removed such that the build-up layer covers the main surface of the chip component and the one surface of the reinforcing substrate.

2. The method of manufacturing a wiring substrate according to claim 1, wherein the reinforcing substrate and the chip component are formed of silicon.

3. The method of manufacturing a wiring substrate according to claim 1, wherein the resin is formed by using a molding process at the fourth step.

4. The method of manufacturing a wiring substrate according to claim 1, wherein a coefficient of elasticity of the resin is equal to or higher than 100 MPa and is equal to or lower than 3000 MPa.

5. The method of manufacturing a wiring substrate according to claim 1, further comprising:
   a sixth step of dicing the reinforcing substrate, which is executed after the fifth step is ended.

6. The method of manufacturing a wiring substrate according to claim 1, wherein at the second step, the through opening and a through hole are formed on the reinforcing substrate, and the method further comprising:
   a through electrode forming step of forming a through electrode in the through hole, which is executed after the second step is ended and before the third step is executed.

7. The method of manufacturing a wiring substrate according to claim 6, wherein the through electrode forming step includes steps of:
   providing a copper plate on the reinforcing substrate having the through opening and the through hole formed thereon;
   feeding a power by using the copper plate to form a copper layer in the through opening and the through hole by electrolytic plating;
   removing the copper plate; and
   removing the copper layer formed in the through opening.

8. The method of manufacturing a wiring substrate according to claim 1, wherein the first step includes a through electrode forming step of forming a through hole on the reinforcing substrate and forming a through electrode in the through hole, which is executed before the first stop providing the tape member on the one surface of the reinforcing substrate.

9. The method of manufacturing a wiring substrate according to claim 1, wherein the through opening is formed to have a size larger than that of the chip component which is inserted therein, and the third step includes inserting the chip component in the through opening and providing the chip component on the tape member such that an outer wall of the chip component is spaced from an inner wall of the through hole.

10. The method of manufacturing a wiring substrate according to claim 9, wherein at fourth step, the resin is received in the space between the outer wall of the chip component and the inner wall of the through hole.

11. The method of manufacturing a wiring substrate according to claim 1, wherein the fourth step includes sealing the reinforcing substrate and the chip component with the resin so as to encapsulate the reinforcing substrate and the chip component in the resin and the tape member.

12. The method of manufacturing a wiring substrate according to claim 6, wherein the through opening and the through hole are spaced from one another along the reinforcing substrate and are formed to penetrate entirely through the reinforcing substrate.

13. The method of manufacturing a wiring substrate according to claim 8, wherein the through opening and the through hole are spaced from one another along the reinforcing substrate and are formed to penetrate entirely through the reinforcing substrate.

14. The method of manufacturing a wiring substrate according to claim 1, wherein the at least one circuit component is a pad.

* * * * *